United States Patent [19]

Murakami et al.

[11] Patent Number: 4,933,761
[45] Date of Patent: Jun. 12, 1990

[54] IMAGE CODING AND DECODING DEVICE

[75] Inventors: Tokumichi Murakami; Kohtaro Asai; Atsushi Itoh; Masami Nishida; Naoto Kinjo; Kenichi Asano, all of Kanagawa, Japan

[73] Assignee: Mitsubishi Denki Kabushiki Kaisha, Tokyo, Japan

[21] Appl. No.: 187,052

[22] Filed: Apr. 27, 1988

[30] Foreign Application Priority Data

| Apr. 28, 1987 | [JP] | Japan | 62-105035 |
| Jun. 12, 1987 | [JP] | Japan | 62-146649 |
| Jul. 14, 1987 | [JP] | Japan | 62-175071 |
| Jul. 30, 1987 | [JP] | Japan | 62-190670 |
| Jul. 30, 1987 | [JP] | Japan | 62-190671 |
| Oct. 19, 1987 | [JP] | Japan | 62-263062 |
| Dec. 28, 1987 | [JP] | Japan | 62-332769 |

[51] Int. Cl.$^5$ ............................................. H04N 7/137
[52] U.S. Cl. .................................. 358/133; 358/135; 358/136; 358/138
[58] Field of Search ............... 358/133, 135, 136, 138

[56] References Cited

U.S. PATENT DOCUMENTS

| 4,558,350 | 12/1985 | Murakami | 358/133 |
| 4,560,977 | 12/1985 | Murakami et al. | 364/807 |
| 4,670,851 | 6/1987 | Murakami et al. | 358/136 |
| 4,710,812 | 12/1987 | Murakami et al. | 358/136 |
| 4,729,020 | 3/1988 | Schaphorst | 358/133 |
| 4,733,298 | 3/1988 | Koga | 358/133 |
| 4,772,947 | 9/1988 | Kono | 358/133 |
| 4,772,956 | 9/1988 | Roche | 358/133 |
| 4,774,587 | 9/1988 | Schmitt | 358/133 |

OTHER PUBLICATIONS

Gray, "Vector Quantization", IEEE Magazine, Apr. 1984, pp. 4–29.
Murakami et al., "Vector Quantizer of Video Signal", Electronics Letters, vol. 18, No. 23, Nov. 1982, pp. 1005–1006.
Murakami et al., "Vector Quantization of Color Images", Proc. of ICASSP, 1986 pp. 133–136.

Primary Examiner—Howard W. Britton
Attorney, Agent, or Firm—Bernard, Rothwell & Brown

[57] ABSTRACT

In an image coding and decoding device, input digital image signals are divided into blocks of prescribed size, and coding processing is performed on differential signals taken between the input block signal and interframe forcasting signals thereby enabling efficient transmission to be performed.

28 Claims, 29 Drawing Sheets

NUMERICAL VALUE REPRESENTS
VECTOR INDEX (L=25)

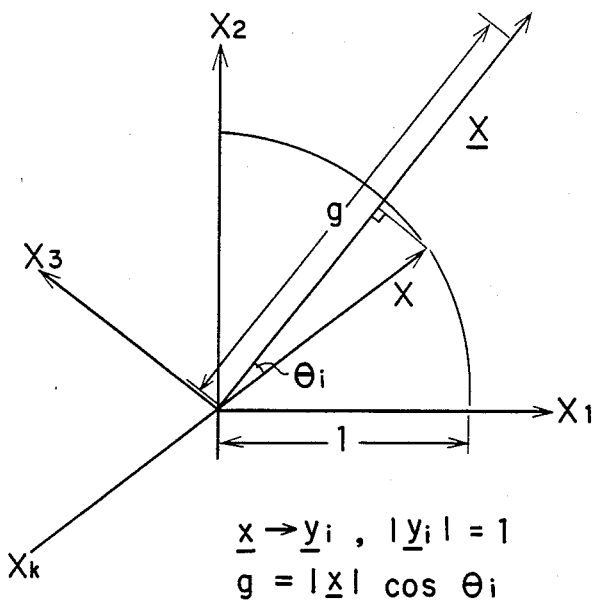
FIG. 8
$\underline{x} \rightarrow \underline{y}_i$, $|\underline{y}_i| = 1$
$g = |\underline{x}| \cos \theta_i$
FIG. 10
(PRIOR ART)
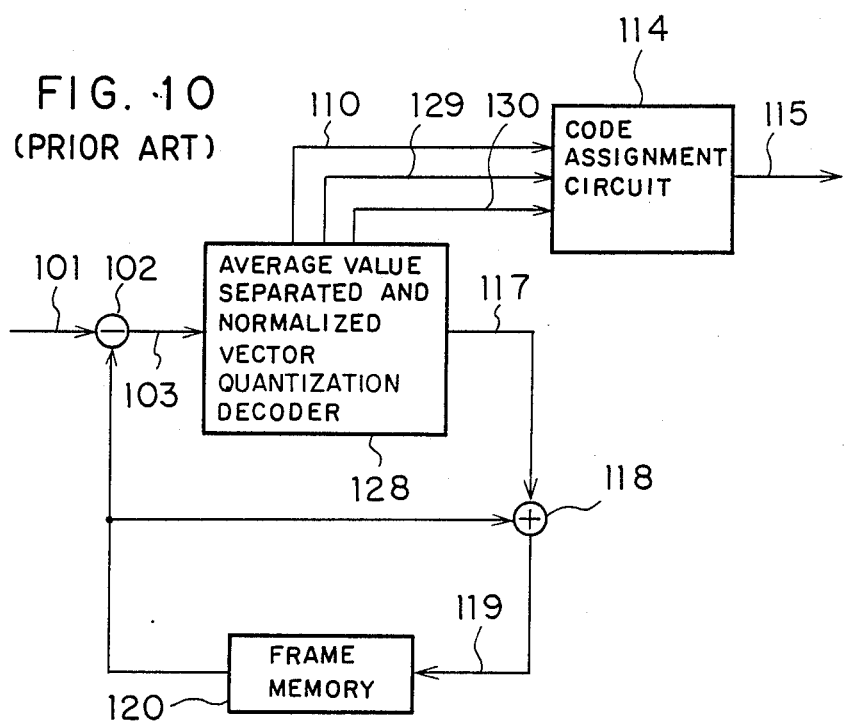

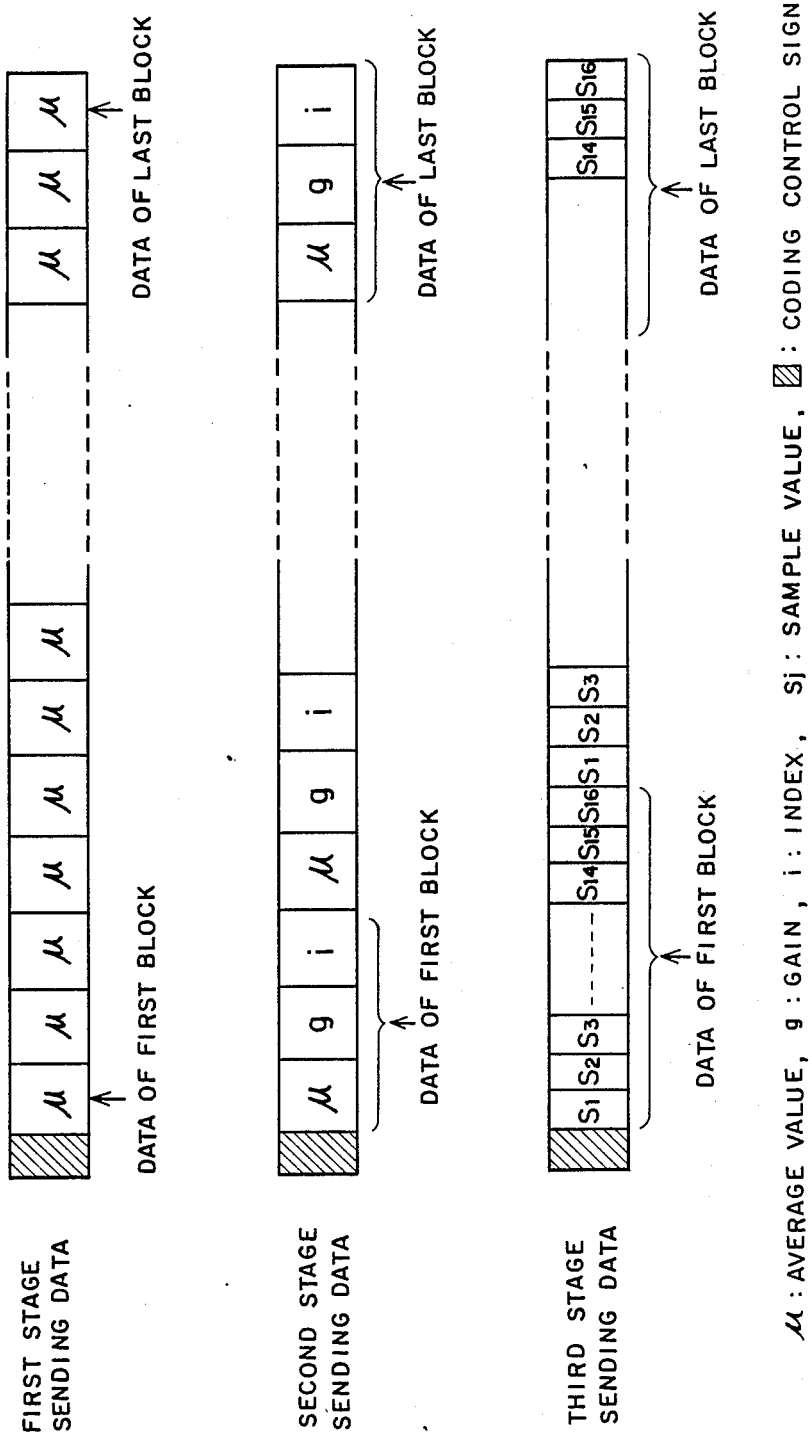

FIG. 20

INPUT VECTOR : $\underline{S} = [S_1, S_2, \cdots S_r, \cdots S_{256}]$ $$u_j = \frac{1}{16} \sum_{r=r_1}^{r_2} S_r$$

$r_1 = (j-1) \times 16 + 1$ $r_2 = j \times 16$

SUBVECTOR : $\underline{u} = [u_1, u_2, \cdots, u_j \cdots u_{16}]$

SUBVECTOR $\hat{\underline{u}} = [\hat{u}_1, \hat{u}_2, \cdots \hat{u}_j, \cdots, \hat{u}_{16}]$ OUTPUT VECTOR $\hat{\underline{S}} = [\hat{S}_1, \hat{S}_2, \cdots \hat{S}_r, \cdots \hat{S}_{256}]$ $\hat{S}_r = \hat{u}_j$ $j = \text{INT}\{(r-1)/16\} - 1$

INT (·) REPRESENTS CONVERSION TO INTEGER BY OMISSION OF FRACTIONS $\underline{x} \rightarrow \underline{y}_i$ , $|\underline{x}_i| = 1$ $g = |\underline{x}| \cos \theta_i$

IMAGE CODING AND DECODING DEVICE

BACKGROUND OF THE INVENTION

1. Field of the Invention

The present invention relates to an image coding and decoding device, and more particularly to an image coding and decoding device which can efficiently code and decode motion image signals so as to transmit and receive the signals by the interframe coding.

2. Description of the Prior Art

FIG. 3 is a block diagram which shows a transmitting section of an image coding transmitter in the prior art. In FIG. 3, numeral 2 designates a motion compensating circuit, numeral 6 designates a differential section, numeral 8 designates a coding and decoding circuit, numeral 11 designates an adder, and numeral 13 designates a frame memory.

FIG. 4 is a block diagram which shows a motion vector detecting section in the motion compensating circuit 2. In FIG. 4, numeral 14 designates a differential section, numeral 16 designates a distortion operator, and numeral 18 designates a comparator.

The operation of the device will be described.

In the motion compensating circuit 2, using digitally transformed input signals 1 and previous frame reconstruction signals 3 stored in the frame memory 13, with the picture element blocks of the prescribed size $N_1 \times N_2$ ($N_1$, $N_2$ being plus integers) used as a unit, a block which has the pattern most similar to that of the block of the input signal is detected from the previous signals, and signals of the detected block are outputted as predicting signals 4, and index information 5 indicating motion vectors being position shift between the position of the block and that of the input signal block is transmitted to the receiving side.

An example of the motion detecting method is shown in FIG. 4.

Assuming that the input signal block is $\underline{S}(1)$, the previous frame signal block is $\underline{S}'_i(3)$, the number of the searched blocks is L (L being plus integer), the matching distortion between the blocks be $d_i(17)$, and $K = N_1 \times N_2$ $$\underline{S} = (S_1, \ldots, S_K), \quad \underline{S}'_i = (S_{i1}', \ldots, S_{iK}'),$$

$$d_i = \sum_{j=1}^{K} |S_j - S_{ij}'| \qquad i = 1 \sim L$$

Among $d_i(11)$ estimated by the differential section 14 and the distortion operator 16 based on the above formulas, the block having the smallest matching distortion value is detected by the comparator 18, and the block signal is transformed into the predicting signal 4 block by block, and the index information 5 of the block motion vectors is outputted. However, in FIG. 4, the hardware composition is simplified by applying the serial process to the distortion operation and the comparing process at each searching block. In FIG. 5, an example of the arrangement of the searching vectors is shown.

Differences between the predicting signals 4 estimated as above described and the input signals 1 are taken, and the differential signals 7 are coded by the coding and decoding circuit 8, and then the coded information 9 is transmitted to the receiving side and at the same time the differential decoded signals 10 by decoding the coded information and the predicting signals 4 are added and thereby the reconstructed signals 12 are obtained. After one frame of these reconstructed signals 12 is stored in the frame memory 13, they are read out as the previous frame reconstructed signals 3 at the next coding.

In the coding and decoding circuit 8, coding is executed only when the value of the differential signals 7 is larger than a prescribed threshold value, and the picture element supplementing (the value of the predicting signals 4 can be made equal to that of the reconstructed signals 12 by making naught the differential reconstructed signals 12 without coding) is performed in other cases; thereby the generating information content can be restrained.

Since the motion compensating device in the prior art is constituted as above described, the searched vectors are limited in number, resulting in the most suitable motion compensation being made impossible because of the image being out of the searched range in case its movement is too extensive. Furthermore there is another problem in that in case of the deterioration of the picture quality, or in case of the changing of scenes, the matching precision between frames is low, and the restraint effect of the predicting error signal component does not appear, causing an increase of the generating information and deterioration of the picture quality.

FIGS. 10 and 11 are block diagrams which show the coding section of the conventional image signal progressive build-up coding and decoding device, and the composition model of the decoding section, which are, for example, disclosed in the column "Vector Quantization of the Image Signal" of the Journal of the Institute of Television Engineers of Japan, Vol. 38, No. 5, pp. 452~457 (1984). In the coding section in FIG. 10, numeral 101 designates the input signal vectors which block the input image signal system of the static image data by the unit of the sample m×n (m, n being integers), numeral 102 designates a subtractor which finds the residual signal vectors 103 between the input signal vectors the previous stage decoded vectors delayed by one frame, numeral 128 designates an average value separated and normalized vector quantization decoder, numeral 110 designates the amplitude coded data, numeral 129 designates the amplitude coded data, numeral 130 designates the output vector index coded data, numeral 114 designates a code assignment circuit, numeral 115 designates the coding device output signals, numeral 117 designates the residual signal decoded vectors, numeral 118 designates an adder which adds the residual signal decoded vectors to the front stage decoded vectors delayed by one frame, numeral 119 designates the decoded vectors, and numeral 120 designates a frame memory for delaying the decoded vectors by one frame.

In the decoding section in FIG. 11, numeral 115 designates the coding device output signals obtained in the code section, numeral 124 designates a coding assignment circuit which inverts the coding assignment, and numeral 131 designates an average value separated and normalized vector quantization decoder which carries out the average value separated and normalized vector quantization decoding.

First, the principle of the vector quantization will be described briefly. The input signal systems of K pieces as a whole shall be made input vectors $\underline{x} = \{x_1, x_2, \ldots, x_k\}$. Then a set of N pieces of the representative points (that is, the output vectors) $\underline{y}_i = \{y_{i1}, y_{i2}, \ldots, Y_{ik}\}$ of K-dimensional Euclid signal space $R^K(x \epsilon R^K)$ shall be made $Y=[y_1, y_2, \ldots, y_N]$. The vector quantizer searches the output vector $y_i$ which is in the shortest distance from the output vectors, and it defines the output vector as follows:

if $d(\underline{x}, \underline{y_i}) < d(\underline{x}, \underline{y_l})$ for all $1 \underline{x} \rightarrow \underline{y_i}$ Where $d(\underline{x}, \underline{y_i})$ indicates the distance between the input and output vectors (distortion). Then the input vector $\underline{x}$ is transmitted or recorded by the index i of the output vectors, and substituted by $\underline{y_i}$ at the reconstruction state.

The average value separated and normalized vector quantization supplies the average value separated and normalized of the input vectors of the vector quantizer so as to limit the distribution of the output vectors on the superunit spherical surface in the multidimensional signal space. Let the input signal vectors be $\underline{S}=\{S_1, S_2, \ldots, S_K\}$, and the average value $\mu$, the amplitude $\sigma$, and the average value separated and normalized vectors $\underline{x}$ are represented respectively as follows:

$$\mu = \frac{1}{k} \sum_{l=1}^{K} S_l$$

$$\sigma = \left[ \frac{1}{K} \sum_{l=1}^{K} (S_l - \mu)^2 \right]^{\frac{1}{2}}$$

$$\underline{x_l} = (S_l - \mu)/\sigma$$

$$\underline{x} = \{x_1, x_2, \ldots, x_K\}$$

Where as the approximate formulas of the amplitude $\sigma$, following formulas can be used.

$$\sigma = \frac{1}{K} \sum_{l=1}^{K} |S - \mu|$$

$$\sigma = \max S_l - \min S_l$$

The scalar quantization of the average value $\mu$ and the amplitude $\sigma$, and the vector quantization of the average value separate input vectors $\underline{x}$ can make the generality of the vector quantizer with the limited number of output vectors much wider so as to develop its coding performance.

The operation of the image signal progressive build-up decoder in the prior art will be described. In FIG. 10, at the first stage of coding, the frame memory 120 which stores the prestage decoded results is left cleared, and the input signal vectors 101 pass through the subtractor 102 as they are, and the average value separated and normalized vector quantization is performed as the residual signal vectors 103 in the average value separated and normalized vector quantizer 128, thereby the coding data 110 of the average value, the coding data 129 of the amplitude, the coding data 130 of the output vector index, and the residual signal decoded vectors 117 are outputted. Each of the coded data 110, 129, 130 is converted into the suitable code words by the code assignment circuit 114 and then transmitted. The residual signal decoded vectors 117 pass through the adder 118, as they are, and are written as the decoded vectors 119 to the frame memory 120. At the second coding stage, in the subtractor 102 the residual signal vectors 103 are obtained by subtracting the previous stage decoded vectors from the input signal vectors 101. The residual signal vectors 103 are quantized into the average value separated and normalized vectors in the average value separated and normalized quantizer 128, thereby the coding data 110 of the average value, the coded data 129 of the amplitude, the coded data 130 of the output vector index, and the residual signal decoded vectors 117 are outputted. Each of the coded data 110, 129, 130 is converted into the suitable code words in the code assignment circuit 114 and then transmitted. The residual signal decoded vectors 117 are added to the front stage decoded vectors in the adder 118 so as to renew the frame memory 120 as the decoded vectors 119. These processes are followed by the same coding operations repeated at each stage so as to transmit each of the coded data 110, 129, 130, resulting in renewing the frame memory 120.

In FIG. 11, when the decoding starts, the frame memory 120 which stores the previous stage decoded results is left cleared. The coding device output signals 115 obtained in the coding section are inverted with respect to the code assignment in the code assignment circuit 124 so as to produce each of the coded data 110, 129, 130. Each of the coded data 110, 129, 130 is inputted into the average separated and normalized vector quantization decoder 131, where the residual signal decoded vectors are obtained from the decoded average value and the amplitude reconstructed vectors. In the adder 118, the residual signal decoded vectors 117 are added to the front stage decoded results of the frame memory 120 so as to renew the frame memory 120. These operations are repeated at each stage. Since the image signal progressive reconstruction coding device in the prior art is composed as above described, it is difficult to control the amount of the coded information generation and the reconstructed image quality suitably in wider range.

FIG. 16 is a block diagram which shows a composition example of a transmission section of an interframe coding device disclosed, for example, in the Technical Report of the Institute of Electronics and Communication Engineers of Japan IE84-1- ('84). In FIG. 16, numeral 201 designates the digitalized motion image signal system, numeral 207 designates a subtractor for obtaining the interframe differential signals, numeral 208 designates the interframe predicting signals formed from the past time frame which already finished coding, numeral 209 designates the interframe differential signal system, numeral 210 designates a block discrimination section which quantizes the interframe differential signals 209 of the predicting error to naught, and discriminates block by block whether the coding at the next stage necessary or not, numeral 211 designates the threshold value for the block discrimination, numeral 212 a coding control section which decides the threshold value 211, numeral 213 designates a coding and decoding section which encodes and decodes the blocks judged as the significant predicting errors (they are called as the significant blocks and the blocks whose predicting errors are regarded as naught are called ineffective blocks) in the block discriminating section 210, numeral 214 designates the decoded predicting error signals obtained in the coding and decoding section 213, numeral 215 designates an adder which adds the predicting signals 208 to the decoded predicting error signals 214, numeral 216 designates the decoded image signal series, numeral 217 designates a frame memory which forms the interframe predicting signals 208 using the decoded image signal series 216, numeral 218 designates the coded data obtained in the coding and decoding section 213, numeral 219 designates a variable length coding section which encodes the coded data 218 in variable length, numeral 220 designates a buffer for smoothing where the variable length coded data processed in the variable length coding section 219 is transmitted at the constant transmitting speed, numeral 221 designates the data that count the variable length coded data series per frame (the amount of the generated information per frame), numeral 222 designates a line interface (I/F) section for transmitting the smoothed data system by the buffer 220 into the transmission line, and numeral 223 designates the transmission signals. FIG. 17 is a block diagram showing a composition example of the coding control section 212 in FIG. 16. In FIG. 17, numeral 232 designates a register for delaying the threshold value 211 in frame period, numeral 233 designates the threshold value delayed by the register 232, and numeral 234 designates a table ROM. FIG. 18 is a diagram which explains the characteristics to be written in the table RAM 234.

The operation of the device will be described. The digitalized image signal series 201 is converted into the interframe differential signals 209 through the subtraction between the interframe predicting signal 208 by the subtractor 207. The interframe predicting signals 208 are formed using the reconstruction image signal system of the past time frame which has finished coding and local decoding in the transmission section; therein some other methods like the motion compensation are sometimes applied. The interframe differential signals 209 come near to naught in the case of no change or movement in a subject, and the block discrimination section 210 discriminates the significant blocks or the insignificant blocks so as to transmit only the data relating to the insignificant blocks resulting in compressing the amount of the information. In order to discriminate blocks, the sum of the absolute value of the blocked interframe differential signal system is found and compared with the threshold value 211. Let the blocked interframe differential signal system be $\epsilon_j$ (j=1, 2, ..., k) and the threshold value be $T_n$, then the discrimination of the blocks is executed as follows:

$$\text{if } K^{-1} \sum_{j=1}^{k} |\epsilon_j| \leq T_n \text{ then insignificant block}$$

$$K^{-1} \sum_{j=1}^{k} |\epsilon_j| > T_n \text{ significant block}$$

Where with respect to the blocks recognized as significant, the interframe differential signals 209 are encoded. The coding and decoding section 213 encodes the significant blocks and then decodes them so as to output the decoded predicting error signals 214 and the coded data 218. There are various coding and decoding methods, but they have little relationship to the invention and the detailed description shall be omitted here. The decoded predicting error signals 214 are added by the adder 215 to the interframe predicting signals 208 so as to form the decoded image signal series 216. The decoded image signal series 216 is stored in the frame memory 217, and used for forming the interframe predicting signals in the next frame and so forth. On the other hand, the coded words are assigned to the coded data 218 in the variable length coding section 219 corresponding to generation frequency of each data. The buffer 220 smooths the speed so as to transmit the variable length coding data system at the constant transmitting speed, and counts the variable length coded data series per frame and outputs them as the information amount 221 per frame to the coding control section 212. The line interface section 222 transmits the speed smoothed variable length coded data as the transmission signals 223 into the transmission line.

The coding control section 212, referring to the table ROM 234 by using the threshold value 221 given the frame delay by the register 232 and the amount of information, outputs the new threshold value 211. Let the previous threshold value 233 be $T_{n-1}$ and the information amount 221 in the encoded frame using this $T_{n-1}$ be $B_{n-1}$, then the new threshold value $T_n$(211) is obtained as shown in FIG. 18. Between the threshold value and the information amount, there is a hyperbolic relation as shown in FIG. 18. In FIG. 18, there are four curves written, which vary according to the width of the movement of a subject. When $B_{n-1}$ and $T_{n-1}$ are given, the most suitable curve is chosen among the plural curves stored in the table ROM 234. Then the point B* of the amount of information is looked for along the chosen curve where B* is the information amount admitted to one frame in accordance with the transmission speed. When the point of the amount of information becoming B* is decided on the chosen curve, the threshold value at the point is read as $T_n$.

In other words, according to the relation between the threshold value $T_{n-1}$ of the frame which finishes the coding and the information amount $B_{n-1}$, the characteristic curve corresponding to the amount of motion is decided and controlled so as to obtain the necessary threshold value to attain the aimed information amount as the new threshold value $T_n$ from the curve.

Since the interframe coding device is constituted as above described, delay is always produced in controlling the threshold value for smoothing the amount of the information. Accordingly it is disadvantageous in that when the subject is transferred from the static state to the dynamic state or from the dynamic state to the static state, an extreme time lapse may be produced or the focusing of the picture quality is likely to be delayed.

FIG. 23 is a block diagram showing a composition example of a transmission section of an image signal progressive reconstruction coding device in the prior art using the vector quantizer, which is disclosed, for example, in the Technical Report of the Institute of Electronics and Communication Engineers of Japan IT85-61 (1985) titling "Image High Performance Coding by Vector Quantization".

In FIG. 23, numeral 301 designates the input signal vectors which block the input signal system of the static image data and so on by every sample m×n (m, n being natural numbers), numeral 302 designates a subtractor which obtains the residual signal vectors of the input signal vectors 301 and the previous stage decoded vectors 319 delayed by one frame, numeral 303 designates the residual signal vectors, numeral 306 designates an average value coding and decoding device which finds the average value within block at each vector and gives the high performance coding and decoding to the average value and outputs the average value coded data 308 and the average value decoded value 309, numeral 307 designates a normalized vector quantization coding and decoding device which converts the residual signal vector 303 into the normalized output vectors and the amplitude gain through the inner product vector quantizer and outputs the vector quantization coded data 310 and the amplitude reconstructed output vector 311, numeral 308 designates the average value coded data, numeral 309 designates the average data decoded value, numeral 310 designates the vector quantization coded data, numeral 311 designates the amplitude reconstructed vector, numeral 312 designates a first adder which adds the average value decoded data to the amplitude reconstructed vector so as to find the residual signal decoded vector 315, numeral 315 designates the residual signal decoded vector, numeral 316 designates a second adder which adds the residual signal decoded vector 315 to the front stage decoded vector 319 delayed by one frame so as to obtain the decoded vector 317 at each stage, numeral 317 designates the decoded vector at each stage, numeral 318 designates a frame memory which delays the decoded vector by one frame, numeral 319 designates the previous stage decoded vector outputted from the frame memory 318, numeral 320 designates a code assignment circuit which transforms the average value coded data 308 and the vector quantization data 310 into the coded words using the variable length coding and then outputs the coded words, and numeral 324 designates the coded output data.

The operation of the device will be described. In FIG. 23, at the time of the first stage coding, the frame memory 318 is left cleared. The input signal vectors 301 are not at all processed in the subtractor 302, but outputted as the residual signal vectors 303 as they are. In the normalized vector quantization coding and decoding device 307, the average value of the residual signal vectors 303 is estimated, and then the average value is subjected to the high performance coding using the DPCM coding method or the like so as to output the average value coded data 308 and the average value decoded data 309 locally decoded. On the other hand, with respect to the normal vector quantization, the residual signal vectors 303 are converted through the inner vector quantizer into the normalized output vectors and the amplitude gain, and the vector quantization coded data 310 and the amplitude reconstructed output vectors 311 are outputted.

The operation principle of the inner product vector quantizer will be described referring to FIG. 24. In the inner product vector quantizer, the average value separation and normalization is given, and a set of the normalized output vector $y_i$ arranged on the unit superspherical surface of the multidimensional signal space, $Y = [\underline{y}_1, \underline{y}_2, \ldots, \underline{y}_N]$ is used. That is, the normalized output vector $\underline{y}_i$ satisfies the following conditions simultaneously.

$$|\underline{y}_i| = \left( \sum_{j=1}^{K} y_{ij}^2 \right)^{\frac{1}{2}} = 1, \sum_{j=1}^{K} y_{ij} = 0$$

The input vector $\underline{x}$ to the inner product vector quantizer is converted through the operation process of the following formulas into the normalized output vector $\underline{y}_i$ which gives the maximum inner product value to the input vector $\underline{x}$, and the maximum inner product value is given as the amplitude gain g of the input vector $\underline{x}$.

$$|\underline{y}_i| = \left( \sum_{j=1}^{K} y_{ij}^2 \right)^{\frac{1}{2}} = 1, \sum_{j=1}^{K} y_{ij} = 0$$

The amplitude gain g found as the scalar quantity is encoded and decoded independently, and the coded data together with the index i of the normalized output vector $\underline{y}_i$ are outputted as the vector quantization coded data 310. At the same time, the normalized output vector $\underline{y}_i$ is multiplied by the local decoding value $\hat{g}$ of the amplitude gain g thereby the amplitude reconstructed output vector $\underline{y}_i^*$ (311) is obtained.

$$\underline{y}_i^* = \hat{g} \underline{y}_i$$

The average data decoded value 309 and the amplitude reconstructed output vector 311 are added in the first adder 312 and thereby the residual signal decoded vector 315 is obtained, and then the residual signal decoded vector 315 is added in the second adder 316 to the previous stage vector 319 delayed by one frame. The decoded vector 317 of each stage being output of the second adder 316 is written in the frame memory 318 and delayed by one frame. On the other hand, the average value coded data 308 and the vector quantization coded data 310 are converted into suitable code words respectively in the code assignment circuit 320 and then transmitted as the coded output data 324. At the second stage and so forth, the above-mentioned coding processes are repeated and executed one after another with respect to the residual signal vectors 303 between the input signal vectors 301 and the previous stage decoded vectors 319 stored in the frame memory 318.

Since the image signal progressive reconstruction coding device is constituted as above described, the block in coding at each stage is always the same in size, and when the block size is made larger the operation scale of the inner product vector quantizer becomes larger in proportion to the dimension number of the vector, and when the block size is made smaller it is difficult to decrease the amount of the coded information at the first stage significantly.

FIG. 28 is a block diagram showing a composition example of an interframe vector quantizer in the prior art disclosed, for example, in Murakami et al. "The Vector Quantization Method Interframe Coding Simulation" in the draft 1175 of the annual meeting 1983 of the Institute of Electronics and Communication Engineers of Japan. In FIG. 28, numeral 401 designates the input image signal system, numeral 402 designates a subtractor which performs subtraction to the interframe predicting signals, numeral 403 designates the interframe predicting signals, numeral 404 designates the interframe differential signals, numeral 439 designates a vector quantization coding section, numeral 440 designates the coded data, numeral 441 designates a vector quantization decoding section, numeral 416 designates decoded interframe differential signals, numeral 417 designates an adder which adds the decoded interframe differential signals 416 and the interframe predicting signals 403, numeral 418 designates the decoded image signal series, numeral 419 designates a frame memory which gives frame delay to the decoded image signal series 418 and forms the interframe predicting signals 403, numeral 420 designates a variable length coding section, numeral 421 designates a buffer for smoothing the speed, numeral 422 designates a value, numeral 423 designates a line interface (I/F), and numeral 424 designates transmission signals.

FIG. 29 is a block diagram showing a composition example of the vector quantization coding section 439. In FIG. 29, numeral 428 designates an average value separation and normalization section, numeral 429 designates the normalized vectors, numeral 431 designates a code book which stores the output vectors, numeral 432 designates the output vectors, numeral 433 designates a distortion operation section which finds distortion between the normalized vectors 429 and the output vectors 432, numeral 436 designates the distortion found in the distortion operation section 433, numeral 437 designates a minimum distortion detecting section which detects the minimum value from the distortion 436, numeral 430 designates the average value and the amplitude which are separated by the average value separation and normalization section 428, numeral 434 designates a block discrimination section, numeral 422 designates the threshold value used for discriminating the blocks, numeral 435 designates the block discrimination information, numeral 438 designates the index of the output vectors giving the minimum distortion, and numeral 440 designates the coded data.

The operation of the device will be described. The interframe predicting signals 403 are subtracted from the input image signal series 401 by the subtractor 402; thereby the input image signal system 401 is converted into the interframe differential signals 404. Since the interframe differential signal has little power in comparison to the original signal, it can be encoded with little coding error. The interframe differential signal 404 is encoded in the vector quantization coding section 439 (the coding method is described afterwards). Then the threshold value 422 is used as a parameter. The coded data 440 encoded in the vector quantization coding section 439 is decoded in the vector quantization decoding section 441; thereby the decoding predicting differential signal 416 is obtained. The interframe predicting signal 403 and the decoded interframe differential signal 416 are added in the adder thereby the decoded image signal series 418 is obtained. The decoded image signal system 418 is stored temporarily in the frame memory 419 and supplied with the frame delay, thereby the interframe predicting signal is formed. On the other hand, the coded data 440 is subjected to variable length coding in the variable length coding section 420 and stored temporarily in the buffer 421 and subjected to speed smoothing process, and then passes through the line interface 423 and is outputted as the transmission signal 424. In the buffer 421, the threshold value 422 in proportion to the data storage amount subjected to variable length coding is outputted and given to the vector quantization coding section 439 so as to control the information amount. Control of the coding and the information amount in the vector quantization coding section 439 will be described. The input signals to be subjected to the vector quantization are the interframe differential signals 404. The signals 404 are blocked (vector) in the average value separation and normalization section 428, and subjected to the average value separating and normalizing process. If the blocked input signals are represented as $\underline{S}=[S_1, S_2, \ldots, S_k]$, the average value separating and normalizing process is expressed for example as follows:

average value $m$: $m = k^{-1} \cdot \sum_{j=1}^{k} S_j$ amplitude $g$: $g = k^{-1} \cdot \sum_{j=1}^{k} |S_j - m|$ average value separate normalization:

$x_j = (S_j - m)/g$

The normalized vectors $\underline{X}=[x_1, x_2, \ldots, x_k]$ obtained as above described are separated from the scalar quantity being the average value and the amplitude, and therefore unified with respect to the probability distribution in comparison to the vectors $\underline{S}$ before the average value separation and normalization, resulting in the effect to improve the efficiency of the vector quantization as hereinafter described. The distortion between the normalized vector 429 and the output vector 432 read from the code book 431 is found in the distortion operation section 433. In the minimum distortion detecting section 437, the minimum value among the distortion 436 between the output vectors stored in the code book 431 and the input vectors 429 is detected, and the index number 438 of the output vector giving the minimum distortion is outputted. This process is the vector quantization. This is expressed in formulas as follows:

distortion $d$:

$$d(\underline{x}, \underline{y}_i) = \sum_{j=1}^{k} |x_j - y_{ij}|$$

wherein $y_j = [y_{i1}, y_{i2}, \ldots, y_{ik}]$ output vector

The maximum inner product value $P_{max}$ is given as the correction amplitude 430 (hereinafter referred to as "g") which approximates $\underline{x}$, namely the magnitude of the average value separated input vector $\underline{x}$ as shown in the following formulas.

$$|\underline{y}_i| = \left[\sum_{j=1}^{k} y_{ij}^2\right]^{\frac{1}{2}} = 1, \frac{1}{k}\sum_{j=1}^{k} y_{ij} = 0$$

$$P_{max} = P(\underline{x}, \underline{y}_i) = |\underline{x}| \cdot |\underline{y}_i| \cdot \cos\theta_i$$
$$= |\underline{x}| \cos\theta_i = g$$

The correction amplitude g is subjected to the high efficient coding in the amplitude coding device 415, and converted into the amplitude coding data 418. In the coded data multiplier 420, the average value coding data 417, the amplitude coding data 418 and the index 419 are multiplied, and transmitted as the output data 421 for the coding device in accordance with the prescribed format.

The decoding operation will be described. The output data 421 for the coding device are separated in the coding data multiplication separating section 422 into the average value coding data 417, the amplitude coding data 418 and the index 419 in accordance with the prescribed format. The average value coded data 417 are decoded through the average value decoding device 423, and converted into the average value coded value 425 (hereinafter referred to as "$\hat{\mu}$"). Similarly $Y=[\underline{y}_1$, $y_2, \ldots, y_i, \ldots, t_N$] represents the contents of the code book.

vector quantization $Q$: $Q(\underline{X}) = y_i$ wherein $d(x, y_i) < d(x, y_m)$ for $m \neq i$ In this case, the coding process is the mapping from $\underline{x}$ to $i$, and the mapping from $i$ to $\underline{y}_i$ (reading-out of the code book) becomes the decoding process. $i$ corresponds to the index 438. The average value and the amplitude 430 are used together with the threshold value 422 to discriminate the blocks in the block discrimination section 434. When the threshold value 422 is made Th, the block discrimination is expressed as follows:

$|m| \leq Th$ and $g \leq Th$ insignificant block $|m| > Th$ or $g > Th$ significant block As for the insignificant block, the interframe differential signal of the block is treated as 0. Consequently, the average value, the amplitude 430 and the index 438 need not be transmitted in this case. The coding data 440 outputted from the vector quantization coding section 439 comprises the average value, the amplitude 430, the block discrimination information 435 and the index 438, but since the block discrimination information 435 only is valid in the case of the insignificant block, the information generating amount can be controlled by the threshold value 422.

Since the interframe vector quantizer in the prior art is constituted as above described, the control range of the information amount is small. Consequently, if the information amount is suppressed to the minimum, the changed parts on the screen are left behind as the insignificant blocks, resulting in producing so-called "pin hole noise".

FIGS. 33 and 34 are block diagrams showing a composition example of a vector quantization coding device and a decoding device using vector quantization technology in the prior art disclosed, for example, in "Image High Efficiency Coding by the Vector Quantization" in the Technical Report of the Institute of Electronics and Communication Engineers of Japan IT85-61 (1985). In FIG. 33, numeral 501 designates the input signal vectors, numeral 502 designates an average value separating circuit which separates the average value component within the vector from the input signal vectors, numeral 503 designates the average value within the vector, numeral 504 designates an average value coding section, numeral 505 designates the average value separated input vectors, numeral 506 designates an inner product operation section which finds the inner product value of the average value separated input vector and the normalized output vectors as hereinafter described, numeral 507 designates a code book ROM which stores a plurality of normalized output vectors, numeral 508 designates the address signals, numeral 509 designates the normalized output vectors, numeral 510 designates an address counter, numeral 511 designates the inner product value calculated in the inner product operation section 506, numeral 512 designates a maximum inner product detecting section which finds the maximum value among the plurality of inner product values, numeral 513 designates the correction amplitude defined by the maximum inner product value, numeral 514 designates the strobe signals, numeral 515 designates an amplitude coding device, numeral 516 designates an index latch which takes the address signals, numeral 517 designates the average value coded data, numeral 518 designates the amplitude coded data, numeral 519 designates the index, numeral 520 designates a coding data multiplexing section, and numeral 521 designates the coded output data.

In the composition example of the vector quantization decoding device in FIG. 34, numeral 522 designates a coded data demultiplexing section, numeral 523 designates an average value decoding device numeral 524 designates an amplitude decoding device, numeral 528 designates a code book ROM, numeral 525 designates the average value decoded value, numeral 526 designates the amplitude decoded value, and numeral 527 designates the decoded vector.

The operation of the vector quantization coding will be described. The input vectors 501 (hereinafter referred to as "$\underline{S}$") constituted by the input signal system blocked every k pieces (k indicates integer being 2 or more) are processed in the average value separating circuit 502 according to the formulas shown downwards, and subjected to separation of the average value 503 (hereinafter referred to as "$\mu$") within the vectors therefrom and transformed into the average value separated input vectors 505 (hereinafter referred to as "$\underline{X}$").

The input vector $\underline{S}$, the average value $\mu$ within the vector, and the average value separated input vector $\underline{X}$ are expressed as follows:

$$\underline{S} = [S_1, S_2, \ldots, S_k]$$

$$\mu = \frac{1}{k} \sum_{j=1}^{k} S_j \, (j = 1, 2, \ldots, k)$$

$$x_j = S_j - \mu$$
$$\underline{X} = [X_1, X_2, \ldots, X_k]$$

The average value $\mu$ is subjected to the high efficiency coding in the average value coding section 504, and converted into the average value coded data 517. The average value separated input vector $\underline{X}$ is inputted in the inner product operation section 506, and converted through the inner product vector quantization coding process as hereinafter described into the correction amplitude 513 as hereinafter described and the index 519 as hereinafter described. The average value separated input vector $\underline{X}$ is normalized with its magnitude $$|\underline{X}| = \left[ \sum_{j=1}^{k} X_j^2 \right]^{\frac{1}{2}}$$

into a plurality of normalized input vectors $\underline{X}^*$, and N pieces (N being natural number) of normalized output vectors 509 [hereinafter referred to as $\underline{y}_i$ ($i = 1, 2, \ldots, N$)] formed according to the statistical property of the normalized input vectors $X^*$ are writtin in the code book ROM 507. When the average value separated input vector $\underline{X}$ is inputted in the inner product operation section 506, the address counter 510 is reset and starts the counter operation of the period N. Then the normalized output vectors $\underline{y}_i$ on the address, which are indicated by the address signals 508 outputted from the address counter 510, are inputted sequentially from the code book ROM 507 into the inner product operation section 506, and the inner product 511 (hereinafter referred to as $P(\underline{x}, \underline{y}_i)$, $i=1, 2, \ldots, N$) between the average value separated input vector $\underline{X}$ and N pieces of the normalized output vectors $\underline{y}_i$ is calculated according to the following formula, and then outputted.

$$P(\underline{x}, \underline{y}_i) = \sum_{j=1}^{k} (x_j y_{ij})$$

Among N pieces of the inner product $P(\underline{x}, \underline{y}_i)$ obtained by the calculation, the maximum inner product value $P_{max}$ is detected in the maximum inner product detecting section 512, and then the address signals 508 showing the address within the code book ROM 507 of the normalized output vector $\underline{y}_i$ giving the maximum inner product value are taken in the index latch 516 at timing synchronized with the strobe signals 514. The taken-in address signals 508 are the index 519 to discriminate the prescribed normalized output vectors $\underline{y}_i$, and transmitted to the coding data multiplexing section 520. On the other hand, the maximum inner product value $P_{max}$ is given as correction amplitude 513 (hereinafter referred to as "g") to simulate amount $|\underline{x}|$ of the average value separated input vector $\underline{x}$ as shown in the following formulas:

$$|y_i| = \left[\sum_{j=1}^{k} y_{ij}^2\right]^{\frac{1}{2}} = 1, \frac{1}{k}\sum_{j=1}^{k} y_{ij} = 0$$

$$P_{max} = P(\underline{x}, \underline{y}_i) = |\underline{x}| \cdot |\underline{y}_i| \cdot \cos\theta_i$$
$$= |\underline{x}| \cos\theta_i = g$$

The correction amplitude g is subjected to the high efficiency coding by the amplitude coding device 515 and converted into amplitude coded data 518. In the coding data multiplexing section 520, the average value coded data 517, the amplitude coded data 518 and the index 519 are multiplied, and then transmitted as the coding device output data 521 according to the prescribed format.

The decoding operation will be described. The coding device output data 521 are separated in the coded data demultiplexing section 522 according to the prescribed format into the average value coded data 517, the amplitude coded data 518 and the index 519. The average value coded data 517 are decoded through the average value decoding device 523 and converted into the average value decoded value 525 (hereinafter referred to as "$\mu$"). In similar manner, the amplitude decoded value 526 (hereinafter referred to as "g") are outputted from the amplitude decoding device 524. From the code book ROM 517 the normalized output vectors $\underline{y}_i$ being on the address instructed by the index 519 are read out, and the recording vectors 527 (hereinafter referred to as "ŝ") to the input vector $\underline{s}$ are obtained through the process of the following formulas.

$$\hat{s} = [\hat{s}_1, \hat{s}_2, \ldots, \hat{s}_k]$$

$$\hat{s}_j = \hat{g} \cdot y_{ij} + \hat{\mu}$$

Since the vector quantizer in the prior art is constituted as above described, it is impossible that the content of the code book is renewed during coding operation, thereby approximation of the decoded vector may be deteriorated to the unusual input vectors with different properties.

FIG. 36 shows an example of an image coding method in the prior art. In FIG. 36, the side A indicates the transmitting side and the side B indicates the receiving side.

In FIG. 36, numeral 601 designates an input buffer which inputs the digitized image signals and outputs them suitably to the coding section at the next stage, numeral 603 designates a frame memory which stores the image signals after coding and decoding before the present image signals by one frame, numeral 602 designates a subtractor which carries out the subtraction between the output of the input buffer 601 and the output of the frame memory 603, numeral 604 designates a quantization coding device which gives the quantization and coding to the output of the frame memory 603, numeral 605 designates a quantization decoding device which decodes the signals after the quantization coding, numeral 606 designates an interframe adder which adds the quantization decoding output and the output of the frame memory 603, and writes the result to the frame memory 603, numeral 607 designates a variable length coding device which assigns the variable length code to the quantization coding output corresponding to the generating frequency of each code, numeral 608 designates a transmitting buffer which stores the variable length coded output, numeral 609 designates a transmitting buffer control section which monitors the control of writing and reading in the transmitting buffer 608 and the storage amount of the transmitting buffer and then transmits the monitoring result to the input buffer 601, numeral 610 designates a dummy data adding section which adds the dummy data to the output of the transmitting buffer, and numeral 611 designates a line interface section.

Numeral 612 designates a line interface section on the receiving side, numeral 613 designates a dummy separating section which deletes the added dummy data, numeral 614 designates a variable length decoding section which decodes the variable length code, numeral 615 designates a receiving buffer which stores the signals after the variable length decoding, numeral 605' is a quantization decoding section which gives the quantization decoding to the output of the receiving buffer 615, numeral 603' designates a frame memory which stores the decoded image signals before the present image signals by one frame, and numeral 606' designates an interframe adder which adds the output of the quantization decoding section 605' and the output of the frame memory 603' and then writes the result to the frame memory 603'.

The operation of the device will be described.

The inputted image signals 701 are written to the input buffer 601. The input buffer performs writing and reading by the unit of the image frame, but it has the composition of double buffer because reading may be performed during writing.

The coded and decoded image signals 702 before the present image signals by one frame are outputted from the frame memory 603. In the interframe subtractor 602, the interframe differential signals 703 are obtained by subtracting between the present image signals 701' read from the input buffer and the image signals 702. The interframe differential signals 703 are encoded by the quantization coding device 604, and become the quantization coded signals 704. FIG. 37 shows an example of characteristics of the quantization coding device. The quantization coded signals 704 are inputted in the variable length coding device 607, and transformed into the variable length code 706 corresponding to the frequency of each coded signal.

At the same time, the quantization coded signals 704 are inputted in the quantization decoding device 605, and then are outputted as the coded and decoded differential signals 705. FIG. 38 shows an example of characteristics of the quantization decoding device.

The coded and decoded differential signals 705 are inputted together with the image signals 702 into the interframe adder 606, and become the coded and decoded image signals 702 and are written to the frame memory 603 for the coding to the next frame.

On the other hand, the variable length codes 706 are inputted in the transmitting buffer 608. The transmitting buffer outputs the data in accordance with the requirement from the transmission line side after storing the variable length codes over the definite amount, and has the composition of double buffer (buffer #1, buffer #2) because writing and reading must be performed at the same time. The transmitting buffer control section 609 controls writing and reading of the transmitting buffer. For example, when the buffer #1 is at writing operation and the buffer #2 is at reading operation, the transmitting buffer control section 609 monitors the storage amount of the buffer #1, and if the storage amount becomes more than the prescribed set value, the transmitting buffer control section 609 demands ceasing of output of the data to the input buffer 601.

Receiving the demands, the input buffer 601 ceases the output of the data to the next stage. The transmitting buffer control section 609 detects the pause of the input data to the transmitting buffer 608, and ceases writing to the buffer #1 and makes the situation of waiting for reading. The buffer #2 during reading ceases reading if the residual amount becomes less than the prescribed set value, and it waits for the buffer #1 to be in the situation of waiting for reading. When the buffer #1 is in the situation of waiting for reading, the buffer #2 and the buffer #1 are read out continuously. The buffer #2 is in the situation of waiting for writing when the residual amount becomes zero.

When the buffer #2 is in the situation of waiting for writing, the transmitting buffer control section 609 demands to start the output of the data to the input buffer 601.

In this process, before the buffer #1 gets in the situation of waiting for reading, there becomes the situation that the transmitting buffer 608 cannot output any data.

The dummy data adding section 610 outputs the data with the dummy data added thereto so as to continue the transmission of the data to the transmission line without break while the transmitting buffer 608 cannot output the data.

The data with the dummy data added thereto are subjected to conversion of electric level in the transmission line interface section 611 so as to meet the characteristics of the transmission line, and then outputted to the transmission line. On the receiving side, the signals inputted through the transmission line are subjected to phase conversion of electric level in the transmission line interface section 612, and the dummy data added in the dummy data adding section 610 are cleared in the dummy separating section 613; thereby only the data about the images are outputted.

The output is processed in the variable length decoding section 614 by the reverse treatment with respect to that in the variable length coding device 607, and then inputted in the form of the quantization coded signals 704 into the receiving buffer 615.

The receiving buffer has the composition of double buffer, because writing and reading are performed at the same time. In the receiving buffer, the stored data are variable in amount so as to take matching with respect to time between the signal speed inputted from the transmission line side and the speed of the image decoding section at the rear stage.

For example, if the processing speed of the image decoding section at the next stage is low, the stored amount of the receiving buffer is increased. On the contrary, if the processing speed is high, the receiving buffer acts at the small stored amount.

The quantization coded signals 704 are decoded by the quantization decoding device 605' and outputted as the coded and decoded differential signals 705' in similar manner to the transmitting side.

The coded and decoded image signals 702' before the present decoding image by one frame are outputted from the frame memory 603', and are added to the coded and decoded differential signals 705' in the interframe adder 606', and the resulting signals are written as the coded and decoded image signals to the frame memory 603' and also outputted to outside.

Let the necessary time to decode one image memory on the receiving side be $T_D$, and let the average time to encode one image memory on the transmitting side be $T_c$, and unless $T_D \leq T_c$, the data are accumulated one after another in the receiving buffer resulting in overflowing.

Since the transmitting side transmits the variable length coding data, the number of the data transmitted by one frame is not kept constant.

In other words, the time interval $T_B$ at which the code corresponds to the lead of the image frame can be $T_B < T_D$ once in a while.

Accordingly, unless $T_D \geq \min T_B$ on the receiving side, it causes the overflowing of the receiving buffer.

Since the image coding device in the prior art is constituted as above described, one frame decoding time $T_D$ on the receiving side is inevitably set to a small value so that $T_D < \min T_B$. As a result, the scale of the device on the receiving side becomes much larger than that on the transmitting side.

SUMMARY OF THE INVENTION

In order to eliminate the above-mentioned disadvantages in the prior art, a first object of the invention is to provide an image coding and transmitting device which suppresses the predicting error component and the amount of the generating information, and prevents the deterioration of the picture quality in case of the great movement of the image or even in case of scene change.

A second object of the invention is to provide an image signal progressive build-up coding and decoding device which controls suitably the amount of the coded information and the reconstructed image quality over a wide range.

A third object of the invention is to provide an interframe coding device which can give the interframe coding by always using the suitable threshold value without delaying in controlling the threshold value.

A fourth object of the invention is to provide an image signal progressive build-up coding device which can vary the block size without increase of the operation scale, and control the amount of the coded information at every stage over a wide range.

A fifth object of the invention is to provide an interframe vector quantizer which can widely control the amount of the information without deteriorating the quality of the reconstructed image too much.

A sixth object of the invention is to provide a vector quantizer which can produce the decoded vector with high approximation even against the unusual input vector.

A seventh object of the invention is to provide an image coding method which can communicate normally without the buffer overflowing even in case that the device scale on the receiving side is small while $T_D$ is comparatively large.

BRIEF DESCRIPTION OF THE DRAWINGS

FIG. 8 is a diagram illustrating inner product vector quantization;

FIG. 9 is a diagram illustrating transmitting sequence of coded output data in this embodiment;

FIG. 10 is a block diagram of a coding section of an image signal progressive build-up coding and decoding device in the prior art;

FIG. 20 is a diagram illustrating operation of the vector/subvector converter in FIG. 19;

FIG. 27 is a block diagram illustrating composition of the first stage vector quantization coding section of the interframe vector quantization coding device;

FIG. 28 is a block diagram illustrating composition of an interframe vector quantization coding device in the prior art;

FIG. 29 is a block diagram illustrating composition of the vector quantization coding section in FIG. 28;

FIG. 30 is a block diagram illustrating composition of a coding section of a dynamic vector quantizer in a sixth embodiment of the invention;

FIG. 31 is a block diagram illustrating composition of a decoding section of the dynamic vector quantizer in FIG. 30;

FIG. 32 is a block diagram illustrating composition of the dynamic code book in FIG. 30;

FIG. 33 is a block diagram illustrating composition of coding section of a vector quantizer in the prior art;

FIG. 34 is a block diagram illustrating composition of a decoding section in FIG. 33;

FIG. 35 is a block diagram of image coding transmission system according to the invention;

FIG. 36 is a block diagram of image coding transmission system in the prior art;

FIG. 37 is a diagram illustrating an example of characteristics of the quantization coding device;

FIG. 38 is a diagram illustrating an example of characteristics of the quantization decoding device; and FIG. 39 is a diagram illustrating operation state of the transmitting buffer.

DETAILED DESCRIPTION OF THE PREFERRED EMBODIMENTS

A first embodiment of the invention will be described referring to FIG. 1–FIG. 2.

Figure 1:
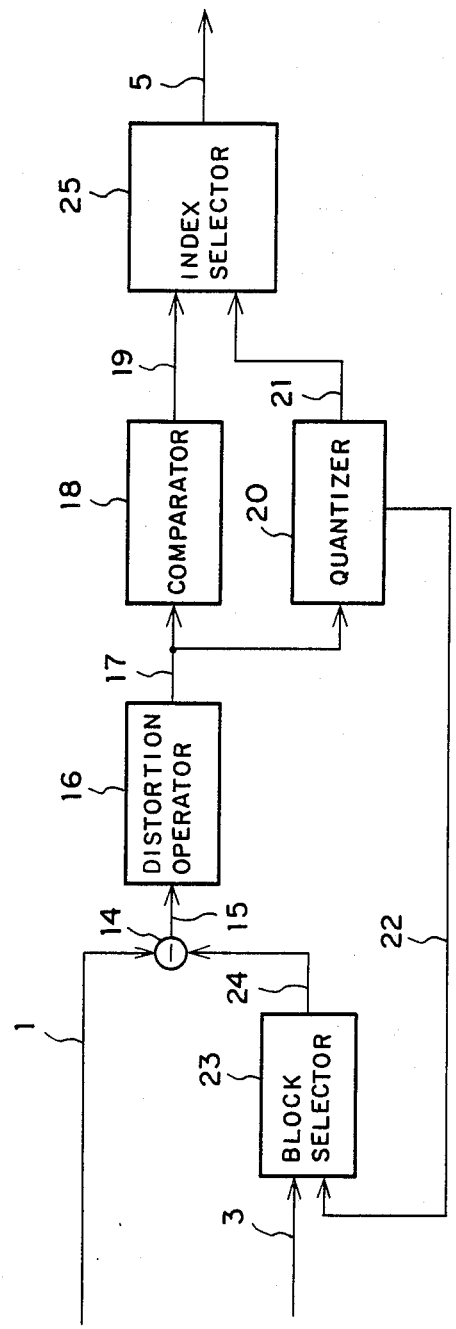
FIG. 1 is a block diagram illustrating inner composition of a motion compensation circuit in a first embodiment of the invention.
Figures 2, 3:
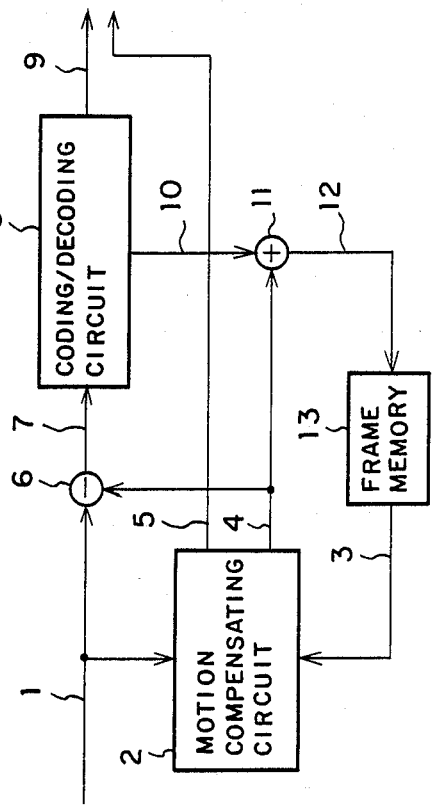
FIG. 2 is a diagram illustrating steps of process of the motion compensation circuit in FIG. 1.
FIG. 3 is a block diagram of a transmitting section of an image coding transmitting section in the prior art.
Figure 4:
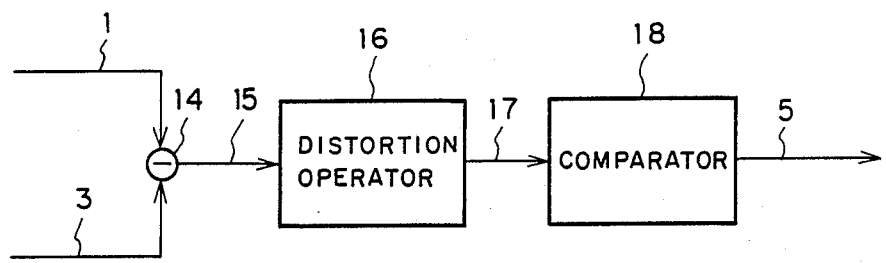
FIG. 4 is a block diagram illustrating inner composition of the motion compensation circuit in FIG. 3.
Figure 5:
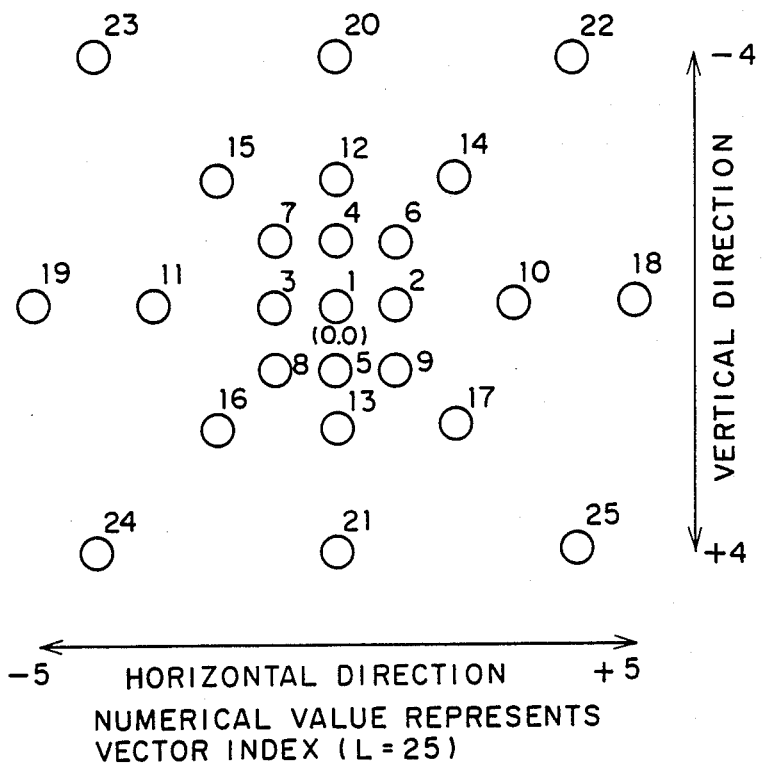
FIG. 5 is an arrangement diagram of searching vectors in the motion compensation circuit in FIG. 3.

In FIG. 1, reference numeral 20 designates a quantizer which quantizes the average value of the input block signals, numeral 23 designates a block selector which changes and outputs a block where previous frame block signals and picture elements within the block are 0 (hereinafter referred to as "0 block") and an average value block, and numeral 25 designates an index selector which changes and outputs motion vector index and quantized level index. Numerals 1–18 are similar to the prior art.

The operation of the device will be described.

In FIG. 1, the interblock matching distortion operation and the comparison operation finish in serial processing with (L+2) times per one input block when the number of the searched vectors is made L (L being plus integer). An example of processing steps is shown in FIG. 2.

Let the input block signals 1 be $S = \{S_1, S_2, \ldots, S_K\}$, and let the reference block signals 24 be $S'_i = \{S'_{i1}, S'_{i2}, \ldots, S'_{iK}\}$, and the calculation algorithm of the matching distortion $d_i$ is similar to the prior art.

In the first processing, the block selector 23 outputs "0" block. In this case, an output 17 of a distortion operator 16 is represented by following formula, and this value becomes the average value m of the input signal blocks. However, the matching distortion operation uses the luminance signals only.

$$m = \sum_{j=1}^{K} |S_j - 0|$$
$$= \sum_{j=1}^{K} S_j$$

The average value m is quantized in the quantizer 20, and the quantization average value $\hat{m}$ 22 is inputted in the block selector 23. On the other hand, the quantization index 21 indicating the quantized level of the quantized average value is outputted to the index selector 25. Let the number of the quantized level be M (M being plus integer), and the quantized index from (L+1) to (L+M) is assigned at each level.

In the second processing, the block selector 23 outputs the average value block $\hat{m}$ having the quantized average value $\hat{m}$ as value of each picture element within the block. The output 17 of the distortion operator 16 in this case is represented by following formula, and this value is made $d_o$.

$$d_o = \sum_{j=1}^{K} |S_j - \hat{m}|$$

where 0 is given as the vector index of the average value block.

In the third processing and so forth, the distortion operation and the comparison operation are the same as noted above. That is, the block selector 23 outputs the previous frame block one after another.

Finally, the output 19 of the comparator 18 becomes the index of the block which gives the minimum matching distortion among (L+1) pieces from $d_o$ to $d_L$ of the matching distortion. In this case, the vector index corresponding to each reference block is assigned as shown in FIG. 2.

In the index selector 25, when the comparator output index 19 is 0, i.e., when the average value block $\hat{m}$ is selected, the quantized index which newly indicates the quantized level of the quantized average value $\hat{m}$ [the value being from (L+1) to (L+M)] is outputted as the vector index 5. In other cases, the value of the comparator output index 19, as it is, is outputted as the vector index 5.

In this embodiment, although the differential absolute sum is represented as the interblock matching distortion, Euclid norm may be used in place of it, and it is possible to increase the priority of the specific reference block by giving weight to the matching distortion in each reference block.

A second embodiment of the invention will be described referring to FIG. 6–FIG. 11.

Figure 6:
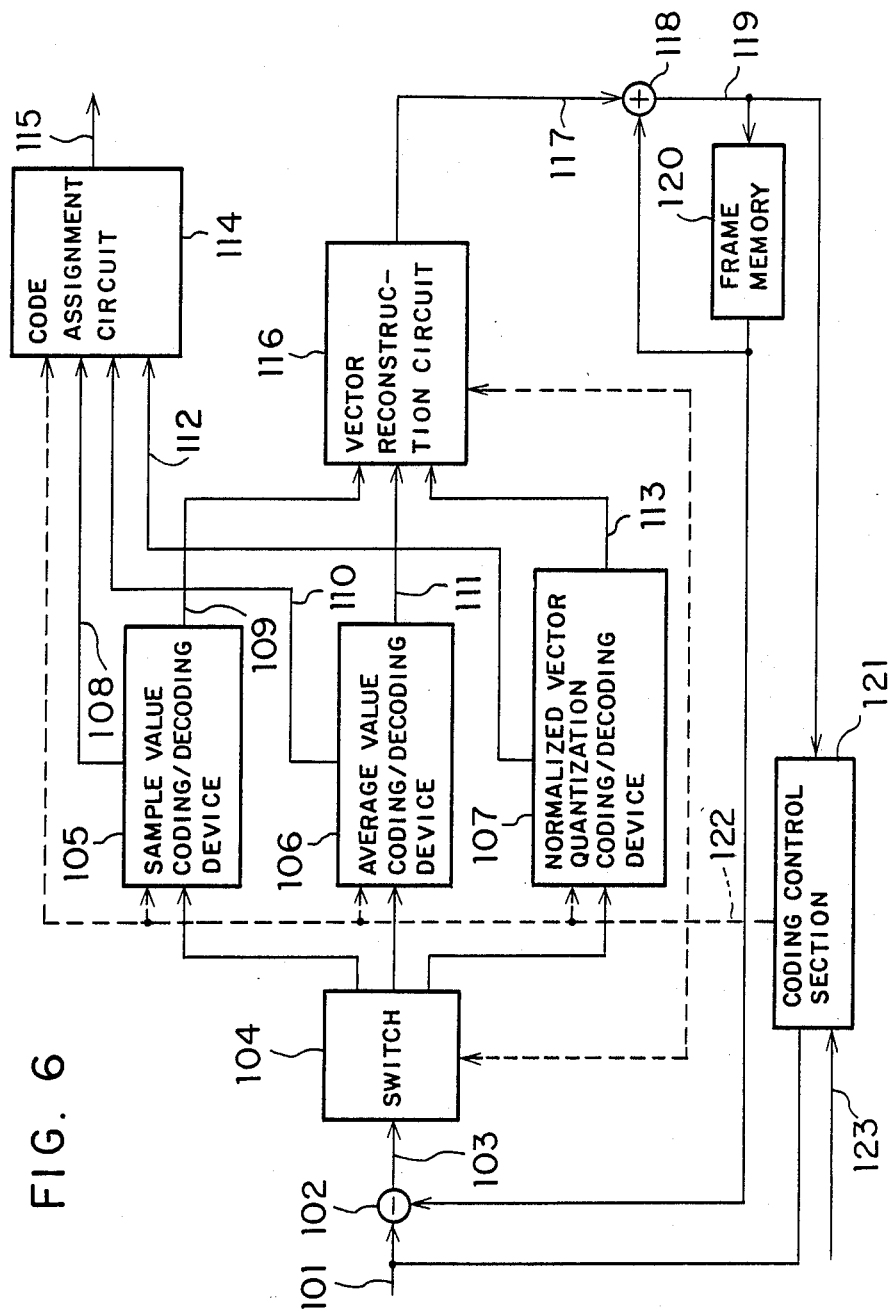
FIG. 6 is a block diagram of a coding section of an image signal progressive build-up coding and decoding device in a second embodiment of the invention.

In FIG. 6, numeral 101 designates input signal vectors which block the input image signal series at each sample m×n (m, n being integers), numeral 102 designates a subtractor which estimates residual signal vector between the input signal vectors and previous stage decoding vectors delayed by one frame, numeral 103 designates the residual signal vectors, numeral 104 designates a switch which controls ON/OFF operation of a sample value coding and decoding device, an average value coding and decoding device and a normalized vector quantization coding and decoding device according to control signals from a coding control section, numeral 105 designates a sample value coding and decoding device which gives coding and decoding to sample value in the prescribed coding mode controlled according to control signals from the coding control section per each sample, numeral 106 designates an average value coding and decoding device which finds the average value within the block per each vector, and gives coding and decoding to the average value in the prescribed coding mode controlled according to control signals from the coding control section, numeral 107 designates a normalized vector quantization coding and decoding device which gives the inner product vector quantization in the prescribed coding mode controlled according to control signals from the coding control per each vector, numeral 108 designates coded data of the sample value, numeral 109 designates decoded value of the sample value, numeral 110 designates coded data of the average value, numeral 111 designates decoded value of the average value, numeral 112 designates coded data of the amplitude and the output vector index, numeral 113 designates output vectors subjected to amplitude reconstruction, numeral 114 designates a code assignment circuit which assigns codes to each coded data according to control signals from the coding control section, numeral 115 designates output signals of the coding device, numeral 116 designates a vector reconstruction circuit which obtains residual signal decoded vectors in the prescribed operation according to control signals from the coding control section, numeral 117 designates residual signal decoded vectors, numeral 118 designates an adder which adds the residual signal decoded vectors and the previous stage decoded vectors delayed by one frame, numeral 119 designates decoded vectors, numeral 120 designates a frame memory which delays the decoded vector by one frame, numeral 121 designates a coding control section which generates control signals to control each coding mode of the switch, the sample value coding and decoding device, the average value coding and decoding device and the normalized vector quantization coding device corresponding to error between the input signal vector and the decoded vector and the number of coding stages, numeral 122 designates control signals from the coding control section, and numeral 123 designates coding stage indicating signals representing the number of coding with the frame unit.

Figure 7:
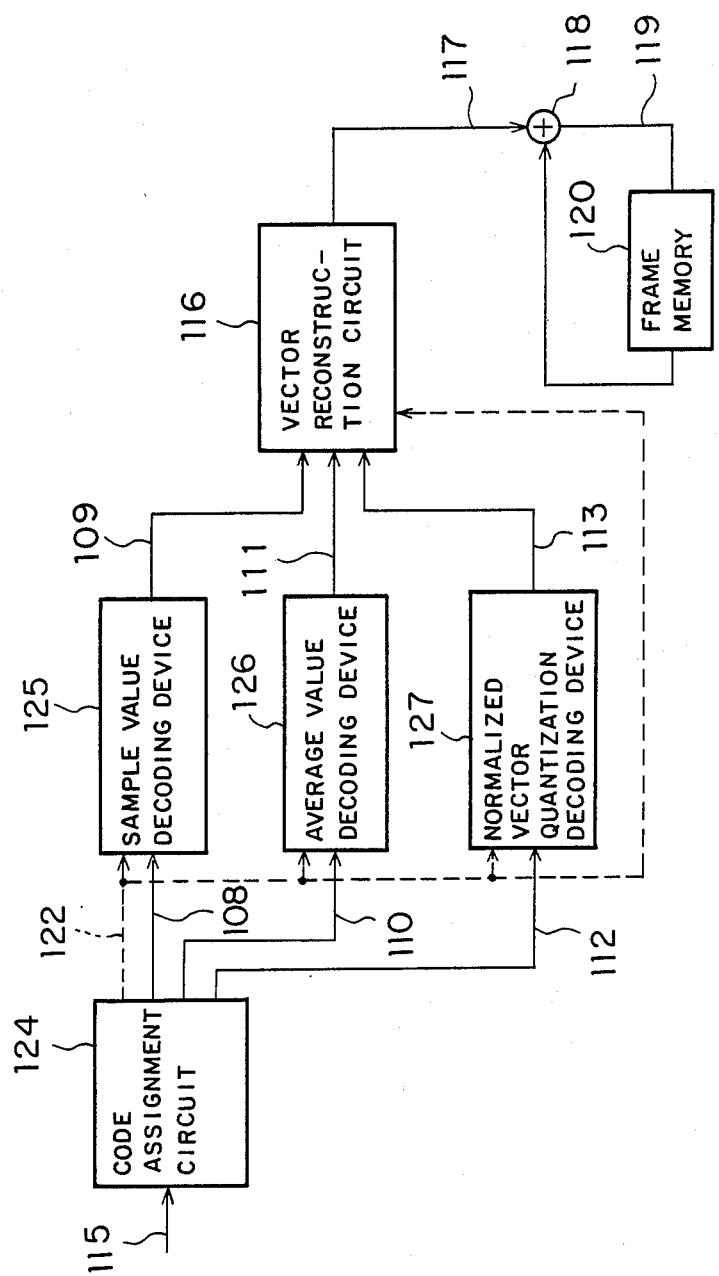
FIG. 7 is a block diagram illustrating composition of the decoding section in FIG. 6.
Figure 11:
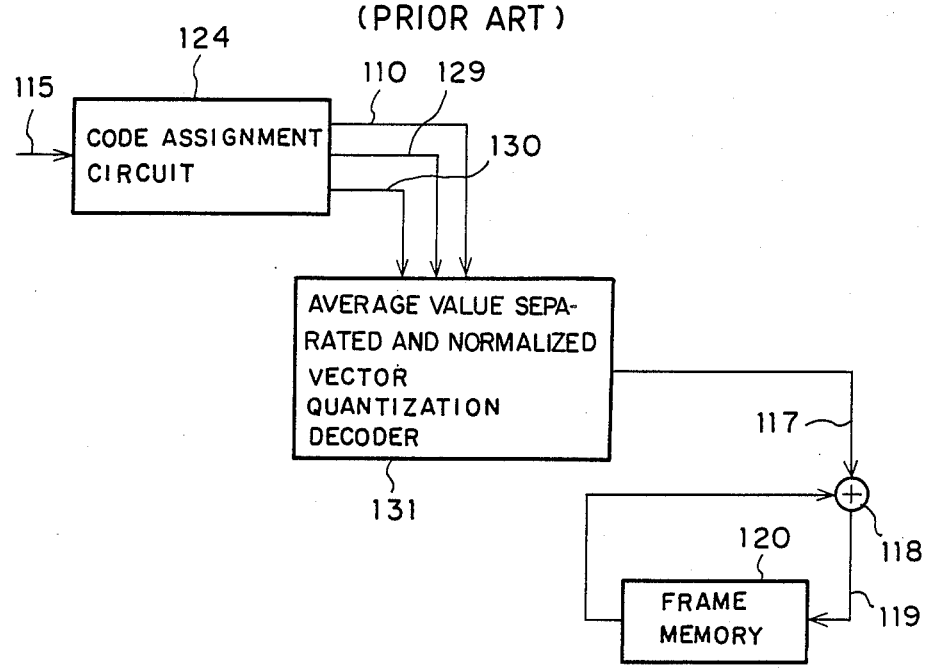
FIG. 11 is a block diagram illustrating composition of a decoding section in FIG. 10.

In FIG. 7, numeral 124 designates a code assignment circuit which carries out the code assignment inversion according to control signals from the coding control section, numeral 125 designates a sample value decoding device which carries out the sample value decoding by the prescribed decoding mode controlled according to control signals from the coding control section per each sample, numeral 126 designates an average value decoding device which carries out the average value decoding by the prescribed decoding mode controlled according to control signals from the coding control section, and numeral 127 designates a normalized vector quantization decoding device which carries out the vector quantization decoding by the prescribed decoding mode controlled according to control signals from the coding control section.

The operation of the device will be described.

In FIG. 6, in the previous stage coding, the frame memory 120 storing the previous stage decoding results remains cleared, and the input signal vectors 101, as they are, pass through the subtractor 102 and are outputted as the residual signal vectors 103. The switch 104 renders only the average value coding and decoding device 106 to ON-state according to the control signals 122 from the coding control section. In the average value coding and decoding device 106, the average value within the block is calculated per each vector, and subjected to coding and decoding in the coding mode controlled according to the control signals 122, and the coded data 110 of the average value and the decoded value 111 are outputted. The coded data 110 of the average value are transformed by the code assignment circuit 114 into suitable code words, and then transmitted together with the control signals 122 in sequence of the first stage transmission data shown in FIG. 9. The vector reconstruction circuit 116 outputs the residual signal decoded vectors 117 having all $m \times n$ samples as the decoded value 111 of the average value according to the control signals 122 from the coding control section. The residual signal decoded vectors 117 pass through the adder 118, and are written as the decoded vectors 119 into the frame memory 120. At the second stage coding, in the subtractor 102, the residual signal vectors 103 by subtraction of the previous stage decoded vectors from the input signal vectors 101 are obtained. The switch 104 renders the average value coding and decoding device 106 and the normalized vector quantization coding and decoding device 107 to ON-state according to the control signals 122 from the coding control section. In the average value coding and decoding device 106, the average value within the block is calculated per each vector, and the coded data 110 of the average value and the decoded value 111 are outputted in the coding mode controlled according to the control signals 122. In the normalized vector quantization coding and decoding device 107, the inner product vector quantization is performed, and the coded data 112 of the amplitude and the output vector index and the output vector 113 regenerated in terms of the amplitude are outputted.

The operation principle of the inner product vector quantization will be described referring to FIG. 8.

In the inner product vector quantization, the average value separation and normalization is given, and a set of the normalized output vector $\underline{y}_i$ arranged on the unit superspherical surface of the multidimensional signal space, $Y = [\underline{y}_1, \underline{y}_2, \ldots, \underline{y}_N]$ is used. That is, the normalized output vector $\underline{y}_i$ satisfies the following conditions simultaneously:

$$|\underline{y}_i| = \left[ \sum_{j=1}^{K} y_{ij}^2 \right]^{\frac{1}{2}} = 1, \sum_{j=1}^{K} y_{ij} = 0$$

The input signal vector $\underline{x}$ is converted through the operation process of the following formulas into the normalized output vector $\underline{y}_i$ which gives the maximum inner product value to the input signal vector $\underline{x}$, and the maximum inner product value is given as the amplitude g of the input signal vector $\underline{x}$.

if $I(\underline{x}, \underline{y}_i) > I(\underline{x}, \underline{y}_l)$ for all $l$ $$\left[ I(\underline{x}, \underline{y}_i) = \sum_{j=1}^{K} (x_j y_{ij}) \right]$$

$$\underline{x} \rightarrow \underline{y}_i$$
$$g = I(\underline{x}, \underline{y}_i) = |\underline{x}| \; |\underline{y}_i| \cos\theta_i = |\underline{x}| \cos\theta_i$$

The amplitude g found as the scalar quantity is encoded independently, and the coded result together with the index i of the normalized output vector $\underline{y}_i$ are outputted as the coded data. At the same time, the normalized output vector $\underline{y}_i$ is multiplied by the decoded value $\hat{g}$ of the amplitude g; thereby the amplitude reconstructed output vector $\underline{y}_i^*$ is obtained.

$$\underline{y}_i^* = \hat{g} \underline{y}_i$$

The coded data 110, 112 are transformed by the code assignment circuit 114 into suitable code words, and are transmitted together with the control signals 122 in sequence of the second stage transmission data shown in FIG. 9. In the vector reconstruction circuit 116, the average value decoded vectors having all $m \times n$ samples as the decoded value 111 of the average value and the amplitude reconstructed output vectors 113 are added according to the control signals 122 from the coding control section, and the residual decoded vectors 117 are outputted. The residual signal decoded vectors 117 are added in the adder 118 to the previous stage decoded vectors, and the decoded vectors 119 as the adding result renew the frame memory 120. At the third stage coding, the residual signal vectors 103 are outputted from the subtractor 102 in similar manner to the second stage coding. The switch 104 renders only the sample value coding and decoding device 105 to ON-state according to the control signals 122 from the coding control section. In the sample value coding and decoding device 105, coding and decoding of the sample value are executed per each sample within the vector in the coding mode controlled according to the control signals 122, and the coded data 108 of the sample value and the decoded value 109 are outputted. The coded data 108 of the sample value are transformed by the code assignment circuit 114 into suitable code words, and transmitted together with the control signals 122 in sequence of the third stage transmission data shown in FIG. 9. In the vector reconstruction circuit 116, according to the control signals 122 from the coding control section, the residual signal decoded vectors 117 composed of the decoded value 109 $m \times n$ pieces of the sample values are outputted. The residual signal decoded vectors 117 are added in the adder 118 to the previous stage decoded vectors, and the decoded vectors 119 as adding result renew the frame memory 120. The same coding operation as that of the third stage is repeated afterwards, and the coded data 108 of the sample value at each stage are transmitted so as to renew the frame memory 120.

On the other hand, in the decoding section, when the decoding starts, the frame memory 120 storing the previous stage decoded result remains cleared, and the coded output signals 115 obtained in the coding section are subjected to the code assignment process in the code assignment circuit 124 and obtained as each coded data. Each coding data is decoded by each of the decoders 125, 126, 127 according to the prescribed mode according to the control signals 122 transmitted at the same time from the coding section, and then outputted as the residual signal decoding vectors 117 from the vector reconstruction circuit 116. The residual signal decoded vectors 117 are added to the previous stage decoded results in the adder 118 so as to renew the frame memory 120.

In the coding control section 121, the average of the error between the input signal vector 101 and the decoded vector 119 in each stage is estimated in one frame period, and in accordance with the average error and the coded stage indicating signals 123, the control signals 122 for feedback control of changing of the switch 104 and changing of the average value coding mode, the normalized vector quantization coding mode and the sample value coding mode in the next stage coding are generated and outputted.

Let the input signal vector be $S$ and the decoded vector be $\hat{S}$, then the error e may be defined, for example, by the following formula:

$$e = \left[ \frac{1}{K} \sum_{j=1}^{K} (S_j - \hat{\hat{S}}_j)^2 \right]^{\frac{1}{2}}$$

In this embodiment, although the average of the error between the input signal vector 101 and the decoded vector 119 in one frame period is used in the coding control section 121 and the feedback control is executed, the error between the residual signal vector 103 and the residual signal decoded vector 117 may be used, and in place of the average of the error in one frame period, the amount of all coded information of one frame period may be used so as to obtain the same effect as the embodiment.

Figure 13:
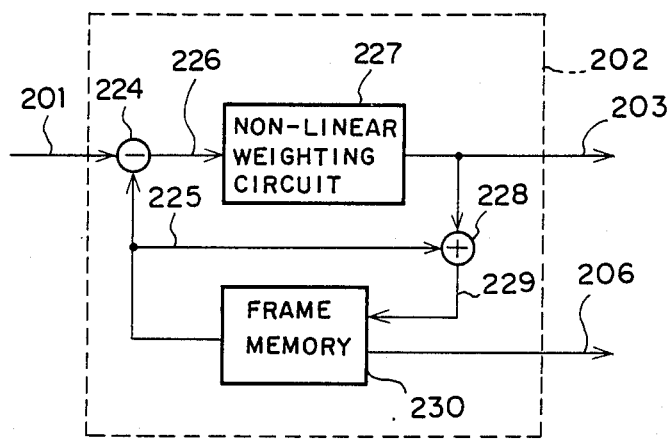
FIG. 13 is a block diagram illustrating composition of the temporal filter in FIG. 12.
Figure 12:
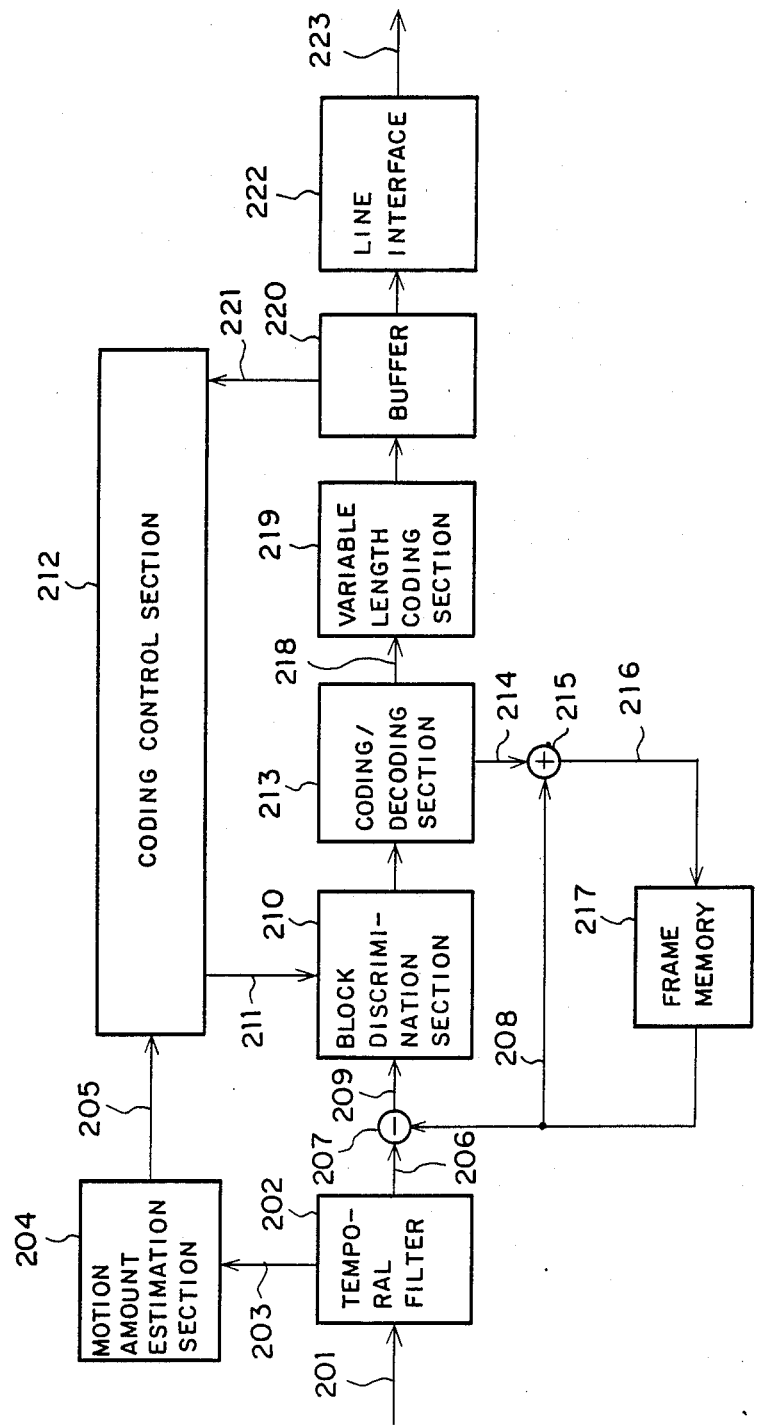
FIG. 12 is a block diagram illustrating composition of a transmitting section of an interframe coding device in a third embodiment of the invention.

FIG. 12 is a block diagram illustrating composition of a transmitting section of an interframe coding device in a third embodiment of the invention. In FIG. 12, numeral 201 designates a digitalized motion image signal system, numeral 202 designates a temporal filter, numeral 203 designates interframe differential signals obtained in the temporal filter 202 and subjected to the non-linear weighting, numeral 204 designates a motion amount estimation section, numeral 205 designates estimated motion amount obtained in the motion amount estimation section 204, numeral 206 designates motion image signal system which is processed by the temporal filter 202 and subjected to conversion of the resolving power or the speed, numeral 207 designates a subtractor for obtaining interframe differential signals, numeral 208 designates interframe predicting signals formed from the past-time frame after finishing the coding already, numeral 209 designates interframe differential signal series, numeral 210 designates a block discrimination section which quantizes the interframe differential signal 209 being the predicting error as zero, and discriminates whether the coding processing at the next stage must be performed or not block by block unit, numeral 211 designates threshold value for the block discrimination, numeral 212 designates a coding control section which determines the threshold value, numeral 213 designates a coding and decoding section which encodes and decodes a block discriminated to have the significant predicting error in the block discrimination section 210, i.e., significant block, numeral 214 designates decoded predicting error signals obtained in the coding and decoding section 213, numeral 215 designates an adder which adds the predicting signals 208 and the decoded predicting error signals 214, numeral 216 designates decoded image signals, numeral 217 designates a frame memory which forms the interframe predicting signals 208 using the decoded image signals 216, numeral 218 designates coded data obtained in the coding and decoding section 213, numeral 219 designates a variable length coding section which gives the variable length coding to the coded data 218, numeral 220 designates a buffer where the data series subjected to the variable length coding in the variable length coding section 219 is transmitted at the definite transmission speed, numeral 221 designates data by counting the variable length coded data per each frame (information amount per frame), numeral 222 designates a line interface where the data system smoothed in the buffer 220 is transmitted to the transmission line, and numeral 223 designates transmitting signals. FIG. 13 is a block diagram illustrating composition of the temporal filter 202 in FIG. 12.

In FIG. 13, numeral 224 designates a subtractor which finds difference between frames, numeral 225 designates image signals of the past-time frame, numeral 226 designates interframe differential signals, numeral 227 designates a non-linear weighting circuit which provides weight to the interframe differential signals 226, numeral 228 designates an adder which adds the interframe differential signals 203 weighted and the image signals 225 of the past-time frame, numeral 229 designates temporal filter output signals obtained by the adder 228, and numeral 230 designates a frame memory which performs frame delay, resolving power conversion or speed conversion.

Figure 14:
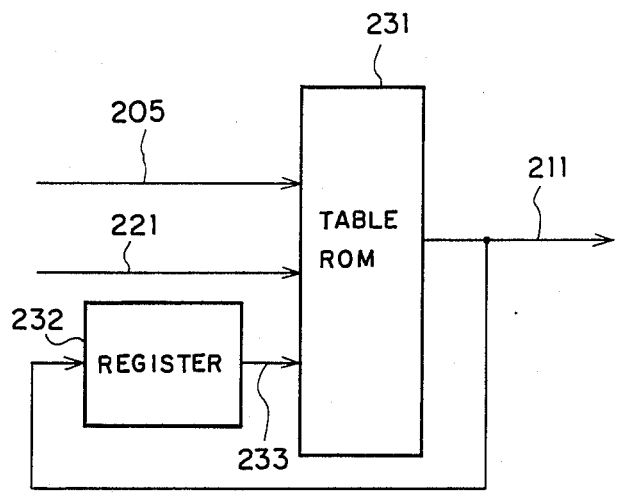
FIG. 14 is a block diagram illustrating composition of the coding control section in FIG. 12.

FIG. 14 is a block diagram illustrating composition of the coding control section 212 in FIG. 12. In FIG. 14, numeral 231 designates a table ROM, numeral 232 designates a register which delays the threshold value 211 at the frame period, and numeral 233 designates threshold value delayed by the register 232.

Figure 15:
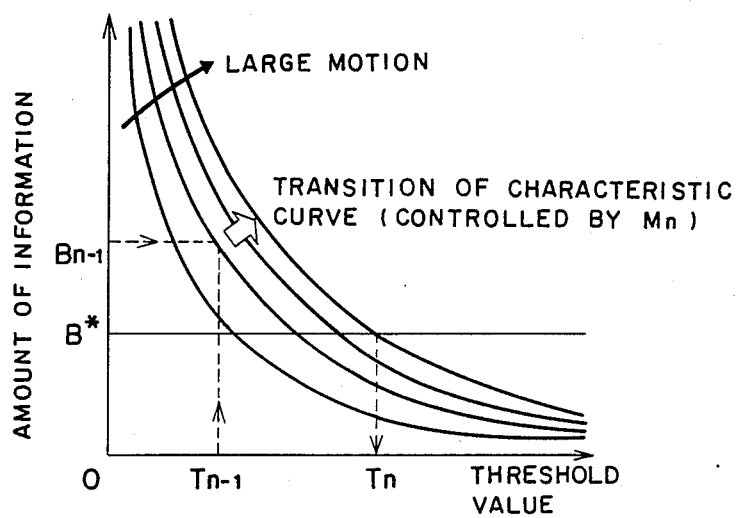
FIG. 15 is a diagram illustrating operation of coding control in this embodiment.
Figure 16:
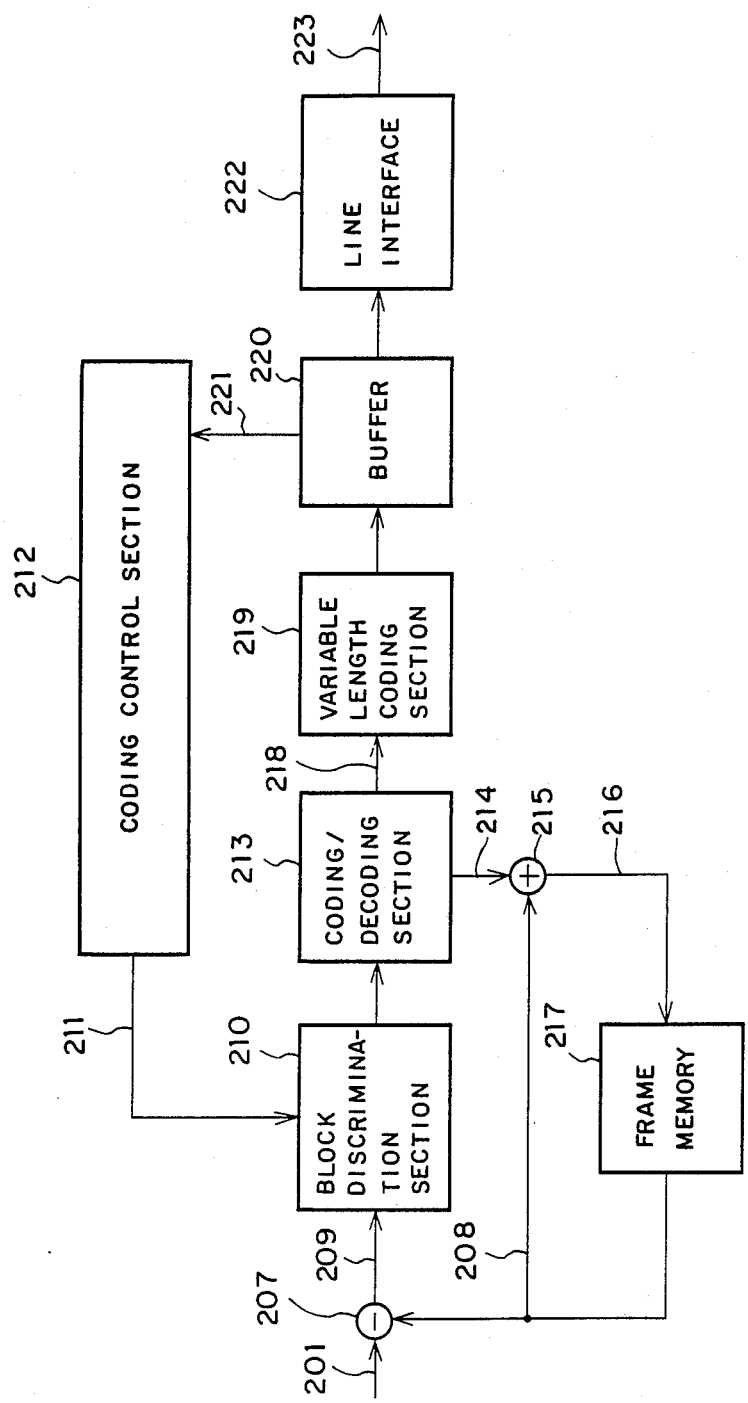
FIG. 16 is a block diagram illustrating composition of a transmitting section of an interframe coding device in the prior art.
Figure 17:
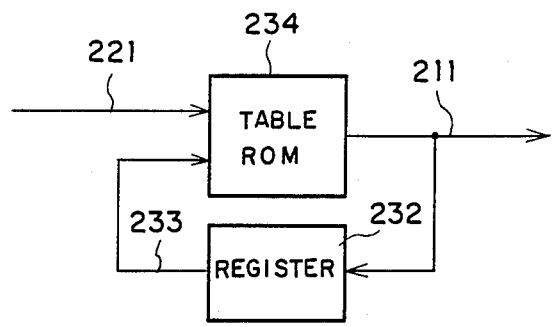
FIG. 17 is a block diagram illustrating composition of the coding control section in FIG. 16.
Figure 18:
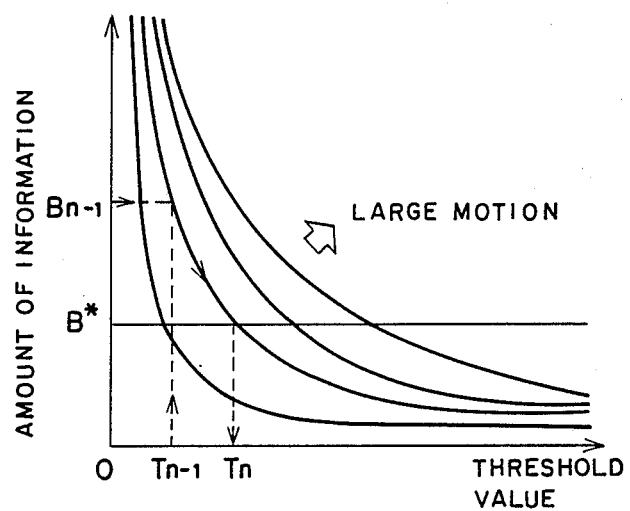
FIG. 18 is a diagram illustrating operation of coding control in the interframe coding device in FIG. 16.

FIG. 15 is a diagram illustrating characteristics to be written in the table ROM 231.

The operation of the device will be described. The digitalized image signal series 201 is first inputted to the temporal filter 202. In the temporal filter 202, subtraction to the previous frame signal 225 is performed by the subtractor 224 and the output is converted into the interframe differential signal 226. The interframe differential signal 226 is made the weighted signal 203 by the non-linear weighting circuit 227, and added to the previous frame signal 225 by the adder 228 into signal 229 subjected to the temporal filter processing. The signal 229 is stored in the frame memory 230, and used in the filter processing of next frame. The frame memory 230 not only gives the frame delay for the temporal filter, but also has function of converting the resolving power or the speed to meet the specification of the coding section or the transmission speed and reading it as the coding input image signals 206. When the transmission speed is low, the coding frames are thinned out, i.e., so-called frame cutting is performed. Then only the frames for coding are read from the frame memory 230, and other frames removed by the frame cutting are overwritten on the memory. Consequently, the time relation between the image signal series 201 and the previous frame signal 225 becomes relation of "frames which are encoded continuously". The weighted interframe differential signal 203 is integrated by one frame in the motion amount estimation section 204, and used as the estimated motion amount 205 for determining the threshold value as hereinafter described. The signal 206 read from the frame memory 230 is subjected to subtraction to the interframe predicting signal 208 by the subtractor 207, and converted into the interframe differential signal 209. The interframe predicting signal 208 is formed using the reconstruction image signals of the past-time frame after finishing the coding and the local decoding in the transmitting section already, and method of the motion compensation or the like may be used in this case. Since the interframe differential signal 209 gets quite close to 0 when the subject has no variation or motion, the significant block and the insignificant block are discriminated in the block discrimination section 210 as above described, and regarding the insignificant block the data indicating it as insignificant only are transmitted thereby the information amount can be compressed. In order to discriminate blocks, the absolute value sum of the interframe differential signal system formed in blocks is estimated, and then compared with the threshold value 211. Let the interframe differential signal series in blocks be $\epsilon_j (j=1, 2, \ldots, k)$, and the threshold be $T_n$, then the block discrimination is performed as follows:

if $K^{-1} \sum_{j=1}^{k} |\epsilon_j| \leq T_n$ insignificant block if $K^{-1} \sum_{j=1}^{k} |\epsilon_j| > T_n$ significant block Regarding the block discriminated as a significant block, further the interframe differential signal 209 is encoded. In the coding and decoding section 213, the significant block is encoded and then decoded, and the decoded predicting error signal 214 and the coded data 218 are outputted. There are various sorts of the coding and decoding methods. However, since these have no direct relation to the essence of the invention, the detailed description shall be omitted here. The decoding predicting error signal 214 is added to the interframe predicting signal 208 by the adder 215 so that the decoded image signals 216 are formed. The decoded image signals 216 are stored in the frame memory 217, and used to form the interframe predicting signal in the next frame and so forth. On the other hand, the coded data 218 is assigned with code words corresponding to the frequency of each data in the variable length coding section 219. In the buffer 220, the speed is smoothed so that the coded data series subjected to the variable length coding is transmitted at the constant transmission speed, and the coded data series in variable length coding is counted per each frame and outputted as the information amount 221 per frame to the coding control section 212. The line interface 222 transmits the variable length coded data with speed smoothed as the transmitting signals 223 to the transmission line.

In the coding control section 212, using the estimated motion amount 205, the information amount 221 and the threshold value 233 supplied with the frame delay by the register 232 and referring to the table ROM 234, the new threshold value 211 is transmitted. Let the estimated motion amount 205 be $M_n$, the past threshold value 233 be $T_{n-1}$, and the information amount 221 in the frame coded using $T_{n-1}$ be $B_{n-1}$, then the new threshold value $T_n$ (211) is obtained as shown in FIG. 15.

Between the threshold value and the information amount, there is hyperbolic relation as shown by four curves in FIG. 15. The four characteristic curves show an example, and vary depending on whether the motion of the subject is large or small. First, from $B_{n-1}$ and $T_{n-1}$, one characteristic curve is selected among a plurality of curves stored in the table ROM 231. The characteristic curve indicates what degree of the motion is included in the frame which is encoded using the threshold value $T_{n-1}$ and generates the information of $B_{n-1}$. Since the estimated motion amount $M_n$ (205) estimates the motion amount of the frame to be encoded hereafter, the motion characteristic curve is suitably transferred using $M_n$. If $M_n$ is large, the curve is transferred to the characteristics with large motion; if $M_n$ is small, the curve is transferred to that with small motion. Subsequently the point with the information amount being $B^*$ is searched along the determined curve. In this case, $B^*$ is the information amount allowed per one frame corresponding to the transmission speed. If the point with the information amount being $B^*$ is determined on the selected curve, the threshold value on the point is read as $T_n$. That is, the characteristic curve corresponding to the motion amount is selected from relation between the threshold value $T_{n-1}$ of the frame after finishing the coding and the information amount $B_{n-1}$. Regarding the frame to be coded hereafter, the characteristic curve is corrected using the estimated motion amount, and control is performed so that the threshold value required to attain the intended information amount is obtained as the new threshold value $T_n$ from the curve.

In this embodiment, although the temporal filter processing or the frame delay by the frame memory 230 to convert the resolving power and the speed is used as means for obtaining the interframe differential signal 203 being the reference signal to estimate the motion amount, of course, the frame memory may be prepared only for estimating the motion amount.

Figure 19:
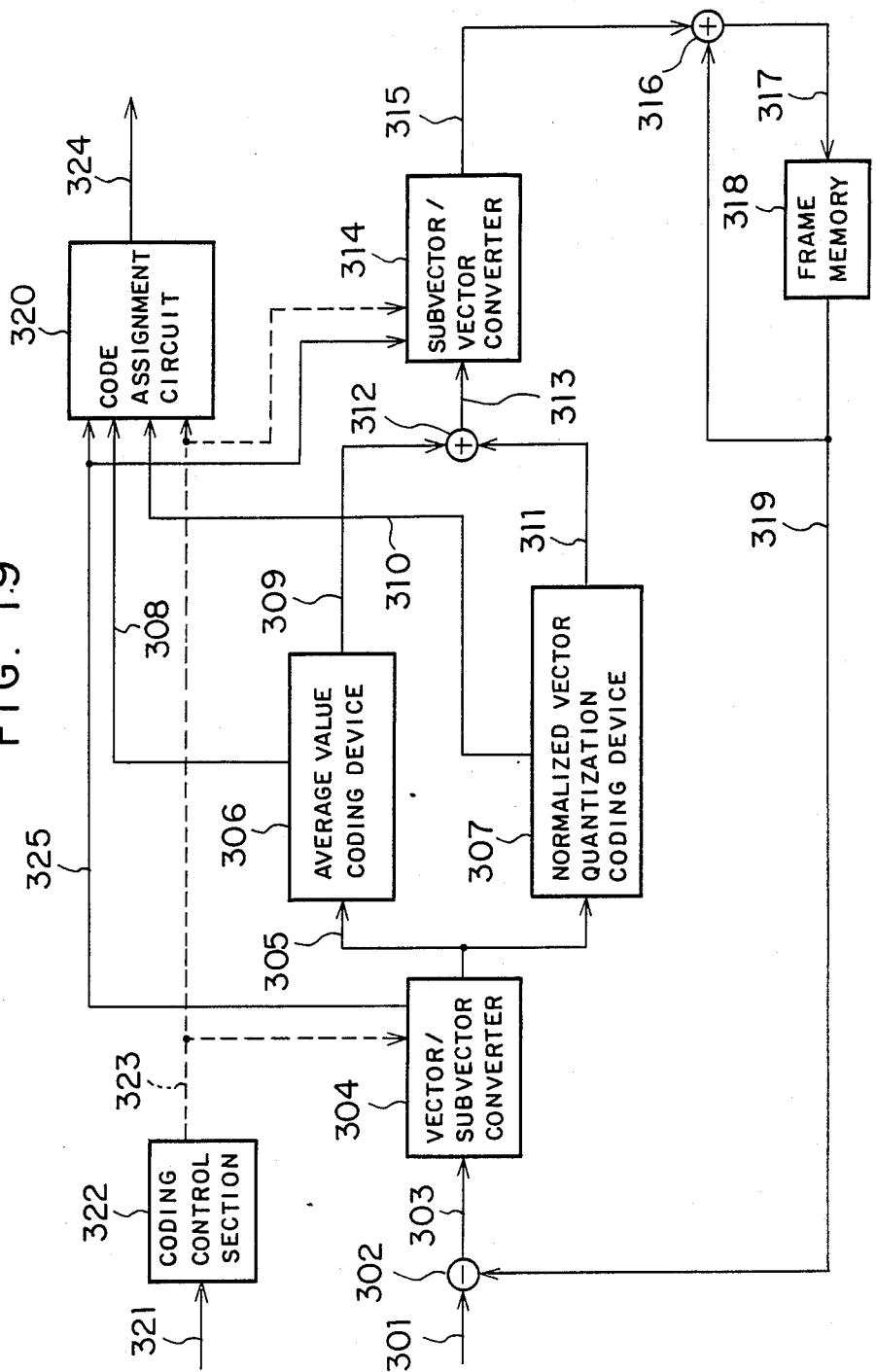
FIG. 19 is a block diagram illustrating composition of a transmitting section of an image signal progressive build-up coding device in a fourth embodiment of the invention.

A fourth embodiment of the invention will be described referring to FIG. 19–FIG. 22. FIG. 19 is a block diagram illustrating composition of a transmitting section of an image signal progressive build-up coding device in the fourth embodiment of the invention. In FIG. 19, numeral 304 designates a vector/subvector converter which reduces the dimension number of the input vector from L (=am×bn), (a, b, m, n being natural number) into K (=m×n) and forms subvector, numeral 314 designates a subvector/vector converter which uses a sample value within the subvector of the dimension number K (=m×n) and forms the vector of the dimension number L (=am×bn) in interpolation reconstruction, numeral 305 designates residual signal subvector, numeral 313 designates residual signal decoding subvector, numeral 322 designates a coding control section which produces control signals 323 indicating parameters a, b, m, n to determine the dimension number L and K of the vectors and the threshold value corresponding to coded stage number 321, and numeral 325 designates discrimination information which indicates whether the coding and decoding to the residual signal vector 303 should be executed or not. Other numerals 301–303, 306–312, 314–320, 324 are similar to those in the device of the prior art.

The operation of the device will be described. In FIG. 19. at the first stage coding, the frame memory 318 remains cleared. The input signal vector 301 of the dimension number L =(am×bn) is not subjected to any processing in the subtractor 302, but outputted as it is as the residual signal vector 303. The residual signal vector 303 is inputted to the vector/subvector converter 304, and subjected to the conversion processing of the dimension number as hereinafter described and converted into the residual signal subvector 305 of the dimension K (=m×n) and then outputted. In the vector/subvector converter 304, the residual signal vector 303 and the residual signal subvector 305 are represented respectively as follows:

input vector; $s = [s_1, s_2, \ldots, s_r, \ldots, s_L]: r\epsilon\{1, 2, \ldots, L\}$
subvector; $u = [u_1, u_2, \ldots, u_j, \ldots, u_K]: j\epsilon\{1, 2, \ldots, K\}$ The sample value $u_j$ in the subvector is given by value of samples in the input vector averaged per a×b samples as shown in the following formulas:

$$\begin{cases} u_j = \frac{1}{a \cdot b} \sum_{r=r_1}^{r_2} s_r \\ r_1 = (j-1) \times a \cdot b + 1 \\ r_2 = j \times a \cdot b \end{cases}$$

FIG. 20 shows relation between the input vector and the subvector when a=b=m=n=4 corresponding to the image signal series of two dimensions.

The residual signal subvector 305 is inputted to the average value coding device 306 and the normalized vector quantization coding device 307, and subjected to the same processing as that of the prior art. As a result, the average value coded data 308 and the average value decoded value 309 are outputted from the average value coding device 306, and the vector quantization coded data 310 and the amplitude constructed output vector 311 are outputted from the normalized vector quantization coding and decoding device 307, and the average value decoded value 309 and the amplitude reconstructed output vector 311 are added in the first adder 312; thereby the residual signal decoded subvector 313 is obtained. The residual signal decoded subvector 313 of K dimensions is subjected to the following processing through the subvector/vector converter 314, and converted into the residual signal decoded vector 315 of L dimensions. In the subvector/vector converter 314, the residual signal decoded subvector 313 and the residual signal decoded vector 315 are represented respectively as follows:

subvector; $\hat{u} = [\hat{u}_1, \hat{u}_2, \ldots, \hat{u}_j, \ldots, \hat{u}_K]: j\epsilon\{1, 2, \ldots, K\}$
output vector; $\hat{s} = [\hat{s}_1, \hat{s}_2, \ldots, \hat{s}_r, \ldots, \hat{s}_L]: r\epsilon\{1, 2, \ldots, L\}$ The sample $s_r$ in the output vector is given in that the same samples in the subvector are arranged repeatedly per a×b samples as shown in the following formulas:

$$\begin{cases} \hat{s}_r = u_j: r\epsilon\{1, 2, \ldots, L\} \\ j = \text{INT}(r-1)/a \cdot b + 1: \text{INT}(\cdot) \text{ represents} \\ \text{conversion to integer by omission of fractions} \end{cases}$$

Figure 21:
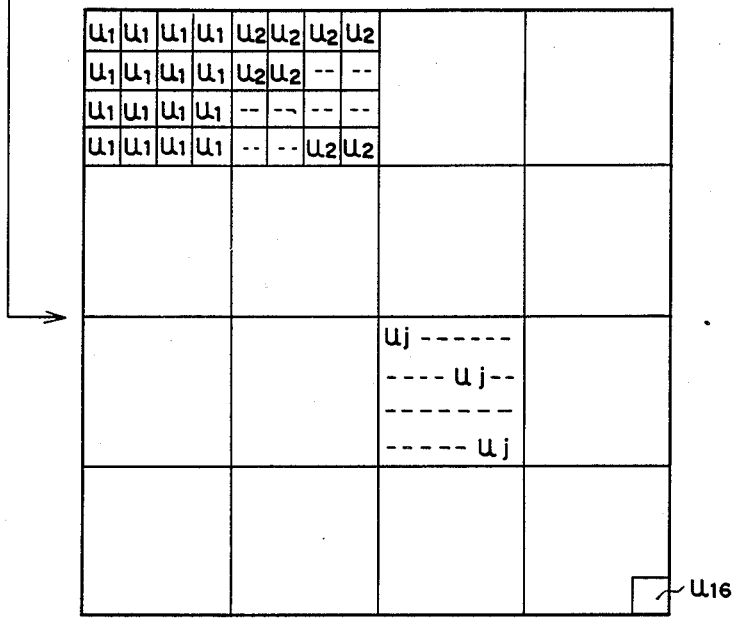
FIG. 21 is a diagram illustrating operation of the subvector/vector converter in FIG. 19.

FIG. 21 shows the sample arrangement in two dimensions of the subvector corresponding to samples in the output vector when a=b=m=n=4.

The residual signal decoded vector 315 is added in the second adder 316 to the previous stage decoding vector 319 delayed by one frame in similar manner to the device in the prior art, and written as the decoded vector 317 in the frame memory 318 and used for the coding in the next stage. The average value coded data 308 and the vector quantization coded data 310 are supplied to the code assignment circuit 320.

Figure 22:
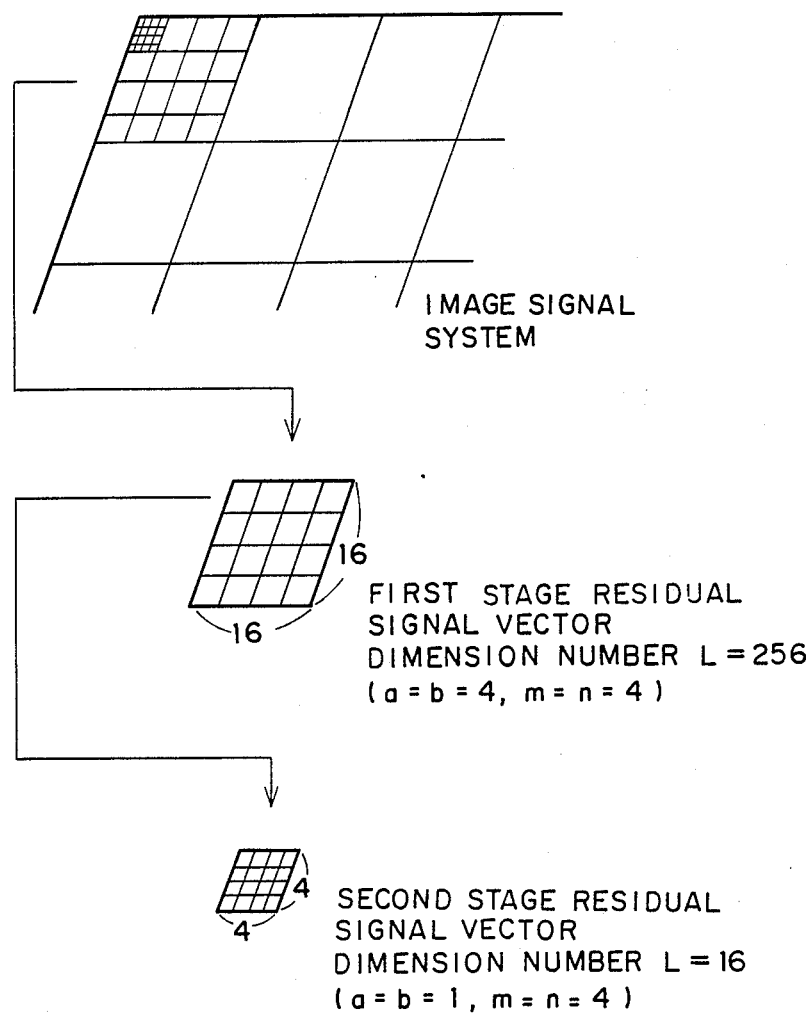
FIG. 22 is a diagram illustrating an example of control means of the coding control section in FIG. 19.
Figure 23:
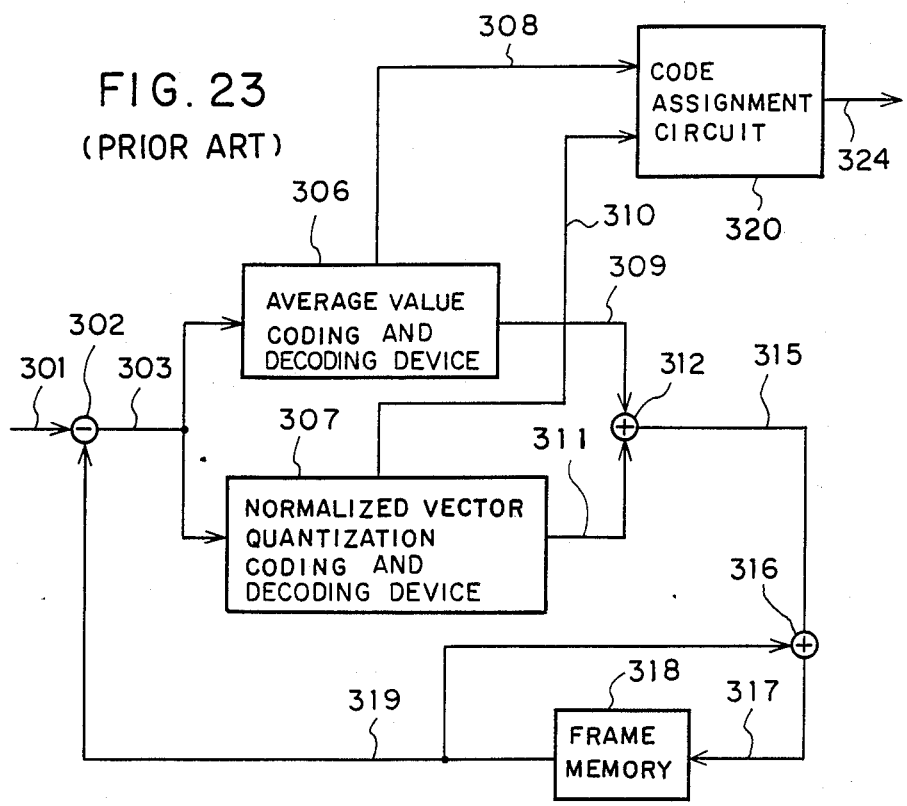
FIG. 23 is a block diagram illustrating composition of a transmitting section of an image signal progressive build-up coding device in the prior art.
Figure 24:
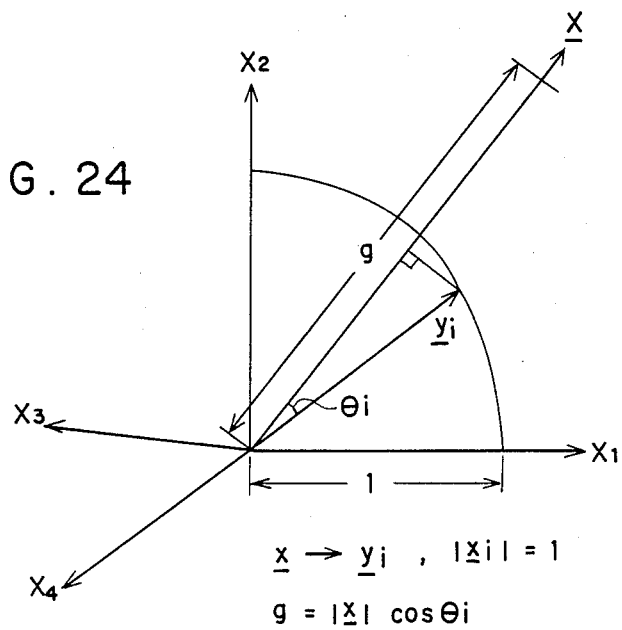
FIG. 24 is a diagram illustrating operation principle of an inner product vector quantizer.

At the second stage and so forth, to the residual signal vector 303 between the input signal vector 301 and the previous stage decoded vector 319 stored in the frame memory 318, the above-mentioned coding processing is executed in sequence repeatedly under following control:

The coding control section 322 produces the parameters a, b, m, n to determine the dimension number of each of the residual signal vector 303, the residual signal subvector 305, the residual signal decoded subvector 313, the residual signal decoded vector 315 in the coding processing and the control signal 323 indicating the threshold value as hereinafter described corresponding to the coded stage number 321, and supplies the control signals 323 to the vector/subvector converter 304, the subvector/vector converter 314 and the code assignment circuit 320. FIG. 22 shows an example of setting method of the dimension number L (=am×bn) of the residual signal vector 303 at the first stage and the second stage corresponding to the image signal system of two dimensions. At the second stage coding processing and so forth, the vector/subvector converter 304 compares the average square value per sample within the residual signal vector 303 with the threshold value supplied from the coding control section 322 in magnitude. As a result of comparison, if the average square value is larger than the threshold value, the coding and decoding processing is executed. If not, the coding and decoding processing is not performed, but all sample values within the residual signal decoded vector 315 outputted from the subvector/vector converter 314 are made 0. The discrimination information 325 indicating result of the magnitude comparison is supplied from the vector/subvector converter 304 to the code assignment circuit 320 and the subvector/vector converter 314.

In the code assignment circuit 320, the control signal 323, the discrimination information 325, the average value coded data 308 and the vector quantization coded data 310 are converted into suitable code words, and then transmitted as the coding output data 324.

In this embodiment, although a plurality of samples of the input vector are combined and averaged and made samples of the subvector in the operation of the vector/subvector converter, samples within the input vector may be extracted according to suitable subsample pattern and made samples of the subvector, and further a smoothing filter for the band limiting may be inserted in the input stage.

Figure 25:
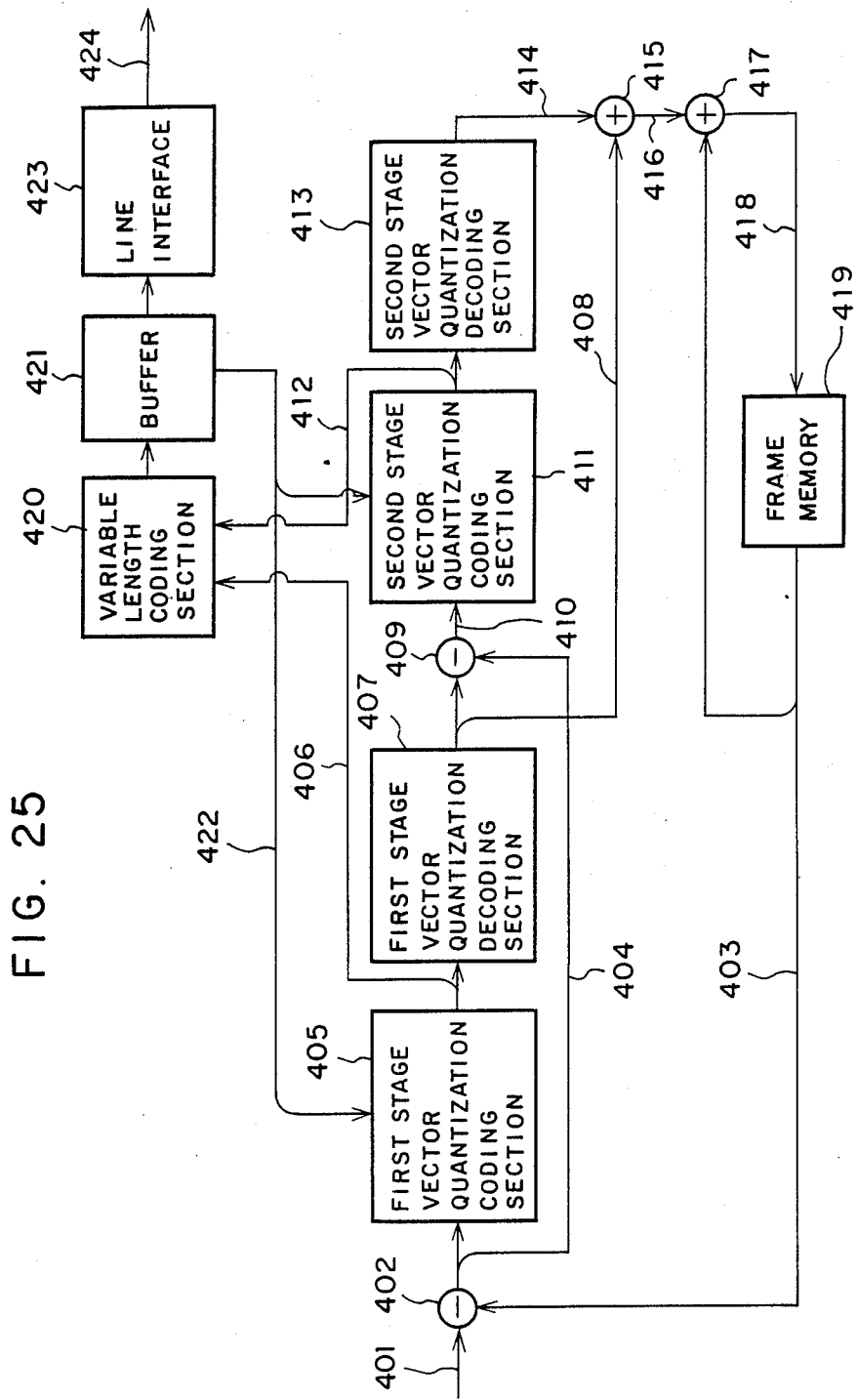
FIG. 25 is a block diagram illustrating composition of an interframe vector quantization coding device in a fifth embodiment of the invention.
Figure 26:
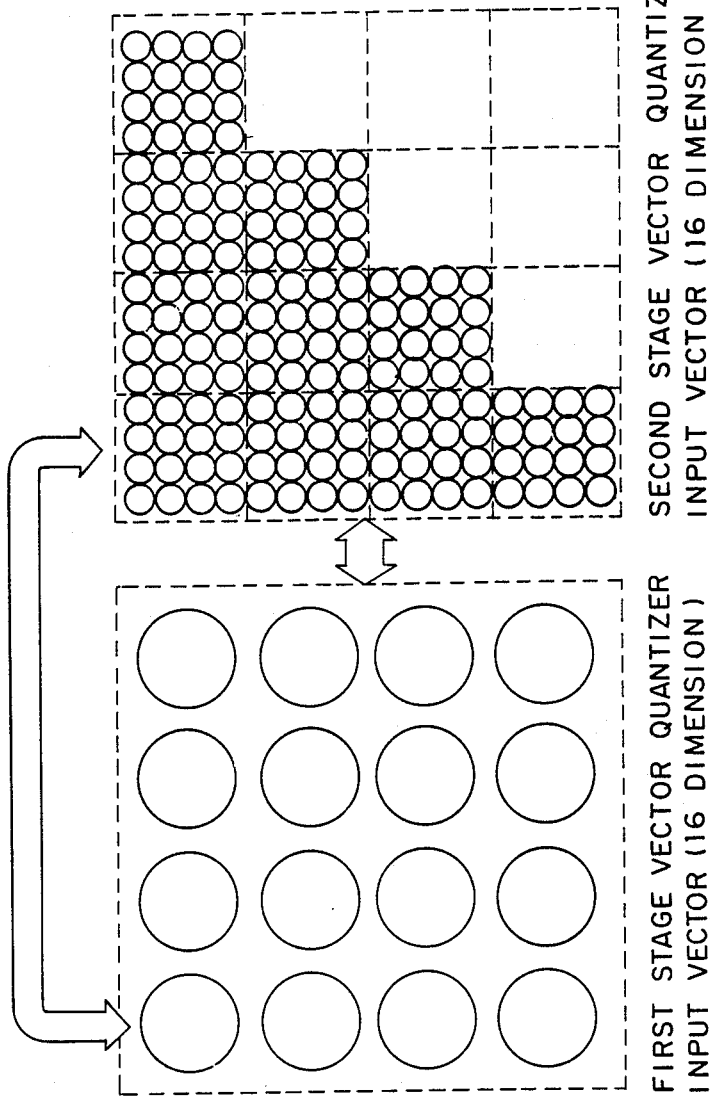
FIG. 26 is a diagram illustrating relation between the first stage vector quantization and the second stage vector quantization in the interframe vector quantization coding device in FIG. 25.

A fifth embodiment of the invention will be described referring to FIG. 24–FIG. 28. FIG. 25 is a block diagram illustrating composition of a coding section of an interframe vector quantization device. In FIG. 25, numeral 401 designates input image signal series, numeral 402 designates a subtractor which performs subtraction to interframe predicting signals, numeral 403 designates interframe predicting signals, numeral 404 designates interframe differential signals, numeral 405 designates a first stage vector quantization coded section, numeral 406 designates first stage coding data, numeral 407 designates a first stage vector quantization decoding section, numeral 408 designates first stage decoded signals, numeral 409 designates a subtractor which finds difference between the interframe differential signals 404 and the first stage decoded signals 408, numeral 410 designates first stage error signals, numeral 411 designates a second stage vector quantization coding section, numeral 412 designates second stage coded data, numeral 413 designates a second stage vector quantization decoding section, numeral 414 designates second stage decoded signals, numeral 415 designates an adder which adds the first stage decoded signals 408 and the second stage decoded signals 414, numeral 416 designates decoding interframe differential signals, numeral 417 designates an adder which adds the interframe predicting signals 403 and the interframe differential signals 416, numeral 418 designates decoded image signal series, numeral 419 designates a frame memory which supplies the decoded image signal system 18 with the frame delay and forms the interframe predicting signals 403, numeral 420 designates a variable length decoding section, numeral 421 designates a buffer for the speed smoothing, numeral 422 designates threshold value, numeral 423 designates a line interface (IF), and numeral 424 designates transmitted signals. FIG. 26 is a diagram illustrating relation between the first stage vector quantization and the second stage vector quantization. FIG. 27 is a block diagram illustrating composition of the first stage vector quantization coding section 405 in FIG. 25. In FIG. 27, numeral 425 designates an average value and amplitude operation section, numeral 426 designates average value, numeral 427 designates average value and amplitude, numeral 428 designates an average value separation and normalization section, numeral 430 designates average value and amplitude, numeral 429 designates normalized vectors, numeral 431 designates a code book which stores output vectors, numeral 432 designates output vectors, numeral 433 designates a distortion operation section which calculates distortion between the normalized vectors 429 and the output vectors 432, numeral 422 designates threshold value, numeral 434 designates a block discrimination section, numeral 436 designates distortion calculated in the distortion operation section 433, numeral 437 designates a minimum distortion detecting section which detects the minimum value of the distortion 436, numeral 435 designates block discrimination information, and numeral 438 designates index of the output vector giving the minimum distortion.

The operation of the device will be described. The input image signal series 401 is subjected subtraction of the interframe predicting signal 403 by the subtractor 402, and converted into the interframe differential signal 404. The interframe differential signal has little power in comparison to the original signal, and therefore can be encoded with little coding error. The interframe differential signal 404 is encoded in the first stage vector quantization coding section 405. Then the threshold value 422 is used as parameter. The coded data 406 encoded in the first stage vector quantization coding section 405 is decoded in the first stage vector quantization decoding section 407; thereby the first stage decoded signal 408 is obtained. The first stage decoded signal 408 is subtracted from the interframe differential signal 404 by the subtractor 409; thereby the first stage error signal 410 is obtained. The first stage error signal 410 has little power further in comparison to the interframe differential signal 404, and therefore can be encoded with little coding error. The first stage error signal 410 is encoded in the second stage vector quantization coding section 411. Then the threshold value 422 is used as parameter. The coded data 412 encoded in the second stage vector quantization coding section 411 is decoded in the second stage vector quantization decoding section 413; thereby the second stage decoded signal 414 is obtained. The first stage decoded signal 408 and the second stage decoded signal 414 are added in the adder 415; thereby the decoded interframe differential signal 416 is obtained. The interframe predicting signal 403 and the decoded interframe differential signal 416 are added in the adder 417; thereby the decoded image signal series 418 is obtained. The decoded image signal series 418 is stored temporarily in the frame memory 419 and supplied with the frame delay; thereby the interframe predicting signal is formed. On the other hand, the first stage coded data 406 and the second stage coded data 412 are subjected to the variable length coding in the variable length coding section 420, and stored temporarily in the buffer 421 and subjected to the speed smoothing processing, and then transmitted as the transmitting signal 424 through the line interface (I/F) 423. In the buffer 421, the threshold value 422 in proportion to the storage amount of the variable length coded data is outputted, and supplied to the first stage vector quantization coding section 405 and the second stage vector quantization coding section 411 so as to control the information generation amount.

Next, referring to FIG. 26 and FIG. 27, the operation of the first stage vector quantization coding section 405 and the second stage vector quantization coding section 411 will be described. As described regarding the interframe vector quantization device in the prior art, in the vector quantization, the picture element is made a plurality of blocks and the output vector with the highest similarity (least distortion) is searched. In FIG. 26, an example of the vector quantized in the first vector coding section 455 and the vector quantized in the second stage vector quantization coding section 411 is shown. The dimensions of the vector in any case are made $4 \times 4 = 16$. In the invention, the average value of interframe differential signals corresponding to the same position on the picture plane as that of the vector quantized at the second stage (formed by the first stage error signal) is made one element, and vector quantized at the first stage is formed. Consequently, as shown in FIG. 26, when the vector quantized at the first stage and the vector quantized at the second stage are overlaid on the picture plane, one piece at the first stage corresponds to 16 pieces at the second stage. This is expressed by formulas as hereinafter described. If the series comprising the interframe differential signals 404 blocked per $4 \times 4 = 16$ pieces is represented as $\underline{S}_i = [S_{i1}, S_{i2}, \ldots, S_{i16}]$, and set comprising the system $\underline{S}_i$ blocked further per $4 \times 4 = 16$ pieces on the picture plane is represented as $[S] = [\underline{S}_1, \underline{S}_2, \ldots, \underline{S}_{16}]$ ($\underline{S}_i \epsilon [S]$, $i = 1 \sim 16$), FIG. 26 is expressed as follows:

block average value $m_i$: $1/16 \sum_{j=1}^{16} S_{ij}$ ($i = 1 \sim 16$)

vector quantized at first stage $\underline{m} = [m_1, m_2, \ldots, m_{16}]$
$\underline{m}$ and $[S] = [\underline{S}_1, \underline{S}_2, \ldots, \underline{S}_{16}]$ are at the same position on the picture plane.

If the first stage decoded signals 408 obtained at the first stage vector quantization decoding section 405 and the first stage vector quantization section 407 are represented as m'=[m$_1$', m$_2$', ..., m$_{16}$'], the first stage error signals 410 to be subjected to the vector quantization at the second stage are the following vectors:

$$\underline{S_i} - m_i' \cdot u = [S_{i1} - m_i', S_{i2} - m_i', \ldots, S_{i16} - m_i']$$
($u$: unit vector)

At the second stage, the above-mentioned vectors are subjected to the average value separation and normalization, and then to the vector quantization as described regarding the interframe vector quantization device in the prior art. Consequently, influence of the first stage vector quantization to the second stage vector quantization relates only to the average value being the scalar quantity, and therein no influence as vector. If there is any influence between both, efficiency of the vector quantization at the second stage is deteriorated by error of the vector quantization at the first stage. If relation between the first stage and the second stage exists only in the scalar quantity as in the case of the invention, the first stage vector quantization does not adversely affect the second stage vector quantization.

FIG. 27 is a block diagram illustrating composition of the first stage vector quantization coding section 405. Input signal to be subjected to the vector quantization is the interframe differential signal 404. The average value and the amplitude of the signal 404 in unit of a block of 4×4=16 pieces calculated in the operation section 425 of average value and amplitude. This block has amount of a block to be subjected to the vector quantization at the second stage. The obtained average value 426 is blocked, and the vector for the first stage quantization is formed and subjected to the average value separation and normalization in the average value separation and normalization section 428. This is expressed by formulas as hereinafter described. The operation in the operation section 425 of average value and amplitude is to calculate $$\text{average value } m_i: m_i = 1/16 \sum_{j=1}^{16} S_{ij}$$

$$\text{amplitude } g_i: g_i = 1/16 \sum_{j=1}^{16} |S_{ij} - m_i|$$

The processing in the average value separation and normalization section 428 is to calculate $$\text{average value } M: M = 1/16 \sum_{j=1}^{16} m_j$$

$$\text{amplitude } G: G = 1/16 \sum_{j=1}^{16} |m_j - M|$$

average value separation and normalization: $x_j = (m_j \ldots M)/G$

Distortion between the normalized vectors X=[x$_1$, x$_2$, ..., x$_{16}$] obtained as above described and the output vectors 432 read from the code book is calculated in the distortion operation section 433. Before this processing, the average value m$_i$ and the amplitude g$_i$ (427) are compared with the threshold value 422 in the block discrimination section 434. Let the threshold value 422 be Th, the block discrimination is represented as follows:

$|m_i| < Th$ and $g_i < Th$    insignificant block $|m_i| > Th$ or $g_i > Th$    significant block Regarding the insignificant block, the coding is not required at the first stage and the second stage. However, since the block discrimination uses the block in the second vector quantization coding device 411 as unit, it is only one element for the block of the first stage. Consequently, in the distortion operation section 433, the distortion of the element corresponding to the insignificant block is estimated as 0. That is, the distortion 436 is usually calculated as follows:

$$\text{distortion } d: d(\underline{X}, \underline{Y_2}) = \sum_{j=1}^{16} |x_j - y_{2j}|$$

However, if the block S$_i$ is insignificant block, since the corresponding element becomes S$_i$→m$_i$→x$_i$, the distortion 436 is calculated as follows:

$$d(\underline{X}, \underline{Y_2}) = \sum_{j=1(j=i)}^{16} |x_j - y_{2j}|$$

In the minimum distortion detecting section 437, among the distortion 436 between the input vector stored in the code book 431 and the input vector 429, the minimum distortion is detected and the index number 438 of the input vector giving the minimum distortion is outputted. The coded data 406 outputted from the first stage vector quantization coding section 405 are the block discrimination information 435, the average value M and the amplitude G (430), and the index 438. However, if all blocks included in the blocks to be quantized at the first stage are insignificant blocks, since information other than the block discrimination information 435 does not have any meaning and need not be transmitted, the information amount can be controlled by the threshold value 422.

Regarding the second stage vector quantization coding section 411, the operation is similar to that of the vector quantization coding section 439 described regarding the interframe vector quantization device in the prior art. In the embodiment, since the threshold value 422 supplied to the second vector quantization coding section 411 may be controlled and only the first stage vector quantization coding section 405 may be used for the coding, the information amount can be significantly controlled.

In this embodiment, although the control of the threshold value is feedback control corresponding to the storage amount of the buffer, it is also effective that the frame memory is installed at the front stage of the coding device and the motion amount is estimated; thereby factor of feedforward is added.

Also in this embodiment, although the fixed output vector set is used in the vector quantization code book at both the first stage and the second stage, it is also effective that the code book for the first stage produces the output vector using frame memory content within the loop and the method of vector quantization or motion compensation is used. Merit in that the average value of the block to perform coding of the second stage is treated as the picture element in the first stage is not limited to the vector quantization, but, for example, use of the orthogonal transformation in coding of the second stage is also effective because higher harmonics are not generated due to error in the first stage.

A sixth embodiment of the invention will be described referring to FIG. 30–FIG. 32. In FIG. 30, numeral 528 designates a dynamic code book RAM in which writing or reading is possible at any time, numeral 529 designates a normalization circuit which normalizes the average value separated input vector $\underline{X}$ in magnitude $\underline{X}$ of the vector, numeral 530 designates normalized coefficient hereinafter referred to as "$\sigma$", and numeral 531 designates normalized input vector hereinafter referred to as "$\underline{X}^*$". Numeral 532 designates a dynamic code book control section which controls the update procedure of the dynamic code book RAM, numeral 533 designates write demand signals, numeral 534 designates normalized input vector with index, numerals 535$a$ $t1$, 535$b$ designate selectors, and numeral 536 designates vector data. In FIG. 31, numeral 537 designates a vector data decoding section.

The vector quantization coding operation in an embodiment of the invention will be described referring to FIG. 30. Input signal vector $\underline{S}$ designated by numeral in FIG. 30 is converted by the average value separate circuit 502 into average value separated input vector $\underline{X}$ designated by numeral 505 in FIG. 30, and then inputted to the inner product operation section 506 and the normalization circuit 529. The average value is processed and transmitted in similar manner to the prior art. The inner product P ($\underline{x}$, $\underline{y}_i$) between the normalized output vector $\underline{y}_i$ which is read from the fixed code book ROM 507 and the dynamic code book RAM 528 and designated by numeral 509 in FIG. 30 and the average value separated input vector $\underline{x}$ is calculated in the inner product operation section 506 in similar manner to the prior art, ' and then the normalized output vector $\underline{y}_i$ giving the maximum inner product value to the average value separated input vector $\underline{x}$ is detected, and the address signal 508 indicating address of the detected normalized output vector $\underline{y}_i$ on the fixed code book ROM or the dynamic code book RAM is outputted as the index 519 from the index latch 516. The maximum inner product value $P_{max}$ is outputted as the correction amplitude g designated by numeral 513 in FIG. 30 from the maximum inner product detecting section 512. In the above-mentioned process, the inner product operation section 506, the maximum inner product detecting section 512, the address counter 510 and the index latch 516 execute the same operation as that of the prior art. The dynamic code book RAM 528 as shown in FIG. 32 is constituted by a FIFO memory in first-in first-out form where writing or reading operation is performed in asynchronous state.

Update is performed at any time according to the update procedure controlled by the dynamic code book control section 532. An example of the update procedure of the content of the dynamic code book RAM 528 will now be described based on an operation example of the dynamic code book control section 532. The average value separated input vector $\underline{x}$ is inputted to the normalization circuit 529 and processed according to the following formulas, and analyzed into the normalization coefficient $\sigma$ designated by numeral 530 in FIG. 30 and the normalized input vector $\underline{X}^*$ designated by numeral 531 in FIG. 30, and then two parameters $\sigma$ and $\underline{X}^*$ are supplied to the dynamic code book control section 532.

$$\sigma = |\underline{x}| = \left[ \sum_{j=1}^{k} x_j^2 \right]^{\frac{1}{2}}$$

$$x^*_j = x_j / \sigma$$

$$\underline{x}^* = [x^*_1, x^*_2, \ldots, x^*_k]$$

In the dynamic code book control section 532, using the normalized coefficient $\sigma$ and the correction amplitude g, the approximation $d^2$ between the average value separated input vector $\underline{x}$ and the normalized output vector $g \cdot \underline{y}_i$ regenerated in amplitude at the decoded state is estimated according to the following formula, and the update procedure of the dynamic code book RAM 528 is adaptively controlled based on the magnitude of the approximation $d^2$.

$$\begin{aligned} d^2 &= (\underline{x} - g\underline{y}_i)^2 \\ &= |\underline{x}|^2 + g^2 |\underline{y}_i|^2 - 2g(\underline{x}, \underline{y}_i) \\ &= \sigma^2 + g^2 - 2g^2 \; [|\underline{y}_i|^2 = 1, (\underline{x}, \underline{y}_i) = g] \\ &= \sigma^2 - g^2 \end{aligned}$$

That is, when the approximation $d^2$ is larger than the allowable value $D^2$, the write demand signal 533 is made $|1|$ and the normalized input vector $\underline{X}^*$ is written in the dynamic code book RAM 528, and at the same time the normalized input vector 534 with index to which prefix is added so as to indicate the writing of the normalized input vector $\underline{X}^*$ is outputted. On the other hand, when the approximation $d^2$ is the allowable value $D^2$ or less, the write demand signal 538 is made $|0|$ and simply outputted. The write control signal 533 is transmitted to the third selector 535$c$, and used to select the coded data transmitted corresponding to the update procedure of the dynamic code book RAM 528. That is, when the write demand signal 533 is $|0|$, since the update of the dynamic code book RAM 528 is not performed, the first selector supplies the correction amplitude g (numeral 513) outputted from the maximum inner product detecting section 512 to the amplitude coding device 515 in similar manner to the prior art, and the second selector 535$b$ transmits the index 519 outputted from the index latch 516 as the vector data 536 to the coding data multiplexing section 520. When the write demand signal 533 is $|1|$, the update of the dynamic code RAM is performed also at the receiving side, and at the same time the normalized output vector $\underline{y}_i$ at the decoded state is replaced by the normalized input vector $\underline{X}^*$ (numeral 531), and in order to transmit the normalized coefficient $\sigma$ (numeral 530) obtained in the normalization processing, the first selector 535$a$ supplies the normalized coefficient $\sigma$ to the amplitude coding device 515 and the second selector 535$b$ supplies the normalized input vector 534 with index as the vector data 536 to the coding data multiplexing section 520. The amplitude coding device 515 performs similar operation to the prior art.

Through the above-mentioned processing, the average value coded data 517, the amplitude coded data 518 and the vector data 536 are multiplied in the coded data multiplexing section 520 according to the prescribed format, and then outputted as the decoded output data 521.

An operation example of the dynamic code book RAM 528 will be described referring to FIG. 32. The read control section 528d reads data on the address assigned by the address pointer, i.e., the normalized output vector $\underline{y}^*$, and repeats the operation in sequence.

When the write demand signal 535 is |1|, the write control section 528b writes the write data, i.e., the normalized input vector $\underline{X}^*$ onto the address assigned by the write address pointer. The address counter 528a counts up the address by 1 at the write finishing point and resets the address to 0 when it exceeds the maximum value, and repeats the operation. When the above-mentioned operation is executed, the newest normalized input vector $\underline{X}^*$ of the definite number determined by the memory capacity can be used as the normalized output vector $\underline{y}_i$ in the vector quantization.

The vector quantization decoding operation in this embodiment will be described referring to FIG. 31. The coded output data 521 are separated in the coded data demultiplexing section 522 according to the prescribed format into the average value coded data 517, the amplitude coded data 518 and the vector data 536.

The average value coded data 517 and the amplitude coded data 518 are decoded in similar manner to the prior art, and converted into the average value decoded value $\hat{\mu}$(numeral 525 in FIG. 31) and the amplitude decoded value $\hat{g}$ (numeral 526 in FIG. 31). In the vector data decoding section, it is discriminated whether the separated vector data 536 is coincident with the prefix added to the normalization input vector or not. If coincident, the write demand signal 533 is made |1|, and the write demand signal 533 and the normalized input vector $\underline{X}^*$ (numeral 531 in FIG. 31) received subsequent to the prefix are outputted. If not coincident, the write demand signal 533 is made |0| and the vector data 536 is outputted as the index 519. The fixed code book ROM 507 and the dynamic code book RAM 528 supply the normalized output vector $\underline{y}_i$ (numeral 509 in FIG. 31) corresponding to the index 519 to the third selector 535c. Further when the write demand signal 533 is |1|, the normalized input vector $\underline{X}^*$ (numeral 531 in FIG. 31) is written in the dynamic code book RAM 528, and the update of the dynamic code book RAM 528 similar to the coding operation is executed. In the third selector 535c, when the write demand signal 533 is |0| the normalized output vector $\underline{y}_i$ (numeral 509 in FIG. 31) is outputted, and when the write demand signal 533 is |1| the normalized input vector $\underline{x}$ (numeral 525 in FIG. 31) is outputted. The vector outputted from the third selector 535c is multiplied by the amplitude decoded value 526, and then the average value decoded value 525 is added, thereby the decoded vector $\hat{\underline{s}}$ (numeral 527 in FIG. 31) is obtained.

In this embodiment, although the average value separation and normalization vector quantization device is shown where the average value of the input vector is separated and the output vector is separated in the average value and normalized, similar effect can be obtained when the input vector is subjected to vector quantization directly, and the dynamic code book RAM is updated based on the vector quantization error.

A seventh embodiment of the invention will be described referring to FIG. 35.

FIG. 35 is a block constitution diagram of an image coding transmission system according to the invention. In FIG. 35, the side Ⓐ indicates the transmitting side, and the side Ⓑ indicates the receiving side.

In FIG. 35, numeral 601 designates an input buffer which inputs the digitized image signals and outputs them suitably to the coding section at the next stage, numeral 603 designates a frame memory which stores the image signals after coding and decoding before the present image signals by one frame, numeral 602 designates a subtractor which carries out the subtraction between the output of the input buffer 601 and the output of the frame memory 603, numeral 604 designates a quantization coding device which gives the quantization and coding to the output of the frame memory 603, numeral 605 designates a quantization decoding device which decodes the signals after the quantization coding, numeral 606 designates an interframe adder which adds the quantization decoded output and the output of the frame memory 603, and writes the result to the frame memory 603, numeral 607 designates a variable length coding device which assigns the variable length code to the quantization coded output corresponding to the frequency of each code, numeral 608 designates a transmitting buffer which stores the variable length coded output, numeral 609 designates a transmitting buffer control section which monitors the control of writing and reading in the transmitting buffer 608 and the storage amount of the transmitting buffer and then transmits the monitoring result to the input buffer 601, numeral 610 designates a dummy data adding section which adds the dummy data to the output of the transmitting buffer, numeral 616 designates a local decoding capability information generation section which generates information indicating time capability of decoding processing at the local receiving side, numeral 617 designates a multiplexing section which multiplies the output of the dummy adding section by the local decoding capability information generated in the section 616, and numeral 611 designates a line interface section.

Numeral 612 designates a line interface section on the receiving side, numeral 619 designates a separate section which separates remote decoding capability information from the receiving data, numeral 618 designates a transmitting operation control section which determines the local transmitting operation from the remote decoding capability information and transmits it to the transmitting side, numeral 613 designates a dummy separate section which deletes the added dummy data, numeral 614 designates a variable length decoding section which decodes the variable length code, numeral 615 designates a receiving buffer which stores the signals after the variable length decoding, numeral 605' designates a quantization decoding section which gives the quantization decoding to the output of the receiving buffer 615, numeral 603' designates a frame memory which stores the decoded image signals before the present image signals by one frame, and numeral 606' designates an interframe adder which adds the output of the quantization decoding section 605' and the output of the frame memory 603' and then writes the result to the frame memory 603'.

The operation of the device will be described.

The inputted image signals 701 are written to the input buffer 601. The input buffer performs writing and reading by the unit of the image frame, but it has the composition of double buffer because reading may be performed during writing.

The coded and decoded image signals 702 before the present image signals by one frame are outputted from the frame memory 603. In the interframe subtractor 602, the interframe differential signals 703 are obtained by subtracting between the present image signals 701' read from the image buffer and the image signals 702. The interframe differential signals 703 are encoded by the quantization coding device 604, and become the quantization coded signals 704. FIG. 37 shows an example of characteristics of the quantization coding device. The quantization coded signals 704 are inputted in the variable length coding device 607, and transmitted into the variable length code 706 corresponding to the frequency of each coding signal.

At the same time, the quantization coded signals 704 are inputted in the quantization decoding device 605, and then are outputted as the coded and decoded differential signals 705. FIG. 38 shows an example of characteristics of the quantization decoding device.

The coded and decoded differential signals 705 are inputted together with the image signals 702 into the interframe adder 606, and become the coded and decoded image signals 702 and are written to the frame memory 603 for the coding to the next frame.

On the other hand, the variable length codes 706 are inputted in the transmitting buffer 608. The transmitting buffer outputs the data in accordance with the requirement from the transmission line side after storing the variable length codes over the definite amount, and has the composition of double buffer (buffer #1, buffer #2) because writing and reading must be performed at the same time. The transmitting buffer control section 609 controls writing and reading of the transmitting buffer. For example, when the buffer #1 is at writing operation and the buffer #2 is at reading operation, the transmitting buffer control section 609 monitors the storage amount of the buffer #1, and if the storage amount becomes more than the prescribed set value, the transmitting buffer control section 609 demands ceasing of output of the data to the input buffer 601.

Receiving the demands, the input buffer 601 ceases the output of the data to the rear stage. The transmitting buffer control section 609 detects the pause of the input data to the transmitting buffer 608, and ceases writing to the buffer #1 and makes the situation of waiting for reading. The buffer #2 during reading ceases reading if the residual amount becomes less than the prescribed set value, and it waits for the buffer #1 to be in the situation of waiting for reading. When the buffer #1 is in the situation of waiting for reading, the buffer #2 and the buffer #1 are read out continuously. The buffer #2 is in the situation of waiting for writing when the residual amount becomes zero.

When the buffer #2 is in the situation of waiting for writing, the transmitting buffer control section 609 demands to start the output of the data to the input buffer 601.

In this process, before the buffer #1 gets in the situation of waiting for reading, there occurs the situation that the transmitting buffer 608 cannot output any data.

The dummy data adding section 610 outputs the data with the dummy data added thereto so as to continue the transmission of the data to the transmission line without break while the transmitting buffer 608 cannot output the data.

In the local decoding capability information generation section, the information 707 indicating time capability of decoding processing at local receiving side, for example, information indicating time $T_D'$ required for processing one image frame is generated.

This information is multiplied in the multiplexing section 617 into that combined with the image dummy data. The signal after multiplexing is converted in the line interface section 611 so that the electric level is matched to characteristics of the transmission line, and then outputted to the transmission line.

At the receiving side, signal inputted through the transmission line is subjected to reverse conversion of the electric level in the line interface section 612, and information 707' indicating time capability of the remote decoding processing is separated from the signal in the separate section 619 and transmitted to the transmitting operation control section 618, and other data are transmitted to the dummy separate section 613. In the dummy separate section 613, the dummy data added in the dummy adding section 610 are cleared; thereby only the data about the image are outputted.

The output is processed in the variable length decoding section 614 by the reverse treatment with respect to that in the variable length coding section 607, and then inputted in the form of the quantization coded signals into the receiving buffer 615.

The receiving buffer has the composition of double buffer, because writing and reading are performed at the same time. In the receiving buffer, the stored data are variable in amount so as to take matching with respect to time between the signal speed inputted from the transmission line side and the speed of the image decoding section at the rear stage.

For example, if the processing speed of the image decoding section at the next stage is low, the stored amount of the receiving buffer is increased. On the contrary, if the processing speed is high, the receiving buffer acts at the small stored amount. The quantization coded signals 704' are decoded by the quantization decoding device 605' and outputted as the coded and decoded differential signals 705' in similar manner to the transmitting side. The coded and decoded image signals 702' before the present decoding image by one frame are outputted from the frame memory 603', and are added to the coded and decoded differential signals 705' in the interframe adder 606', and the resulting signals are written as the coded and decoded image signals to the frame memory 603' and also outputted to outside.

On the other hand, at the transmitting operation control section 618, based on the information 707', discrimination is performed regarding what degree of the coding capability at the local transmitting side enables the decoding processing without overflowing of the receiving buffer at the remote station.

For example, if time $T_D'$ is required to decode one frame as the information 707', command is issued so that the interval to transmit the code corresponding to the lead of each image frame from the transmitting buffer is always made $T_D'$ or more.

Operation of the transmitting buffer control section 609 receiving the code will now be described in detail.

FIG. 39 shows state of the transmitting buffer control section typically when the buffer #1 is at reading state and the buffer #2 finishes the writing and is waiting for reading. Usually, if the transmitting buffer stores data more than the prescribed set value (Th2 in FIG. 39) during writing, stoppage of data output is demanded to the input buffer 601. In FIG. 39, the buffer #2 stops the writing at the storage amount M.

On the other hand, reading from the transmitting buffer is performed at a burst in the N data unit, and when the residual amount of the buffer during reading becomes less than N, reading is performed only the buffer at reverse side is at waiting for reading, and reading is stopped at other cases.

When command is issued from the transmitting operation control section 618 that transmitting interval of the code corresponding to the lead of the image frame is made $T_D'$ or more, output of data corresponding to the lead of the image frame from the transmitting buffer is checked. Once the corresponding data is outputted, the timer is set to the time $T_D'$ and supervision is performed so that next corresponding data is not outputted before the timer becomes time out.

If it is recognized that the corresponding data exists in the N data to be subsequently transmitted before the time outs next reading is inhibited.

The longer the read inhibiting time, the longer the time of output stop command for data to the input buffer 601. Consequently, the image frame number which can be encoded per unit time is decreased.

Since the dummy data are transmitted to the transmission line during read inhibiting of the transmitting buffer, data of only image after the dummy data separation at the receiving side is intermittent in time, thereby longer time can be used for the decoding processing at the receiving side.

Consequently, even at the image coding device having the receiving side of large $T_D'$, since transmission at the remote transmitting side is performed in matching with the local capability (limiting the capability at the transmitting side), although the image frame number is small and quality as the motion picture image is deteriorated, the device at the receiving side is made of small size and at low cost.

In this embodiment, in order that the transmission image frame number at the transmitting side is drawn to the limit of the capability at the receiving side, output of the data corresponding to the lead of the image from the transmitting buffer is limited. However, if the operation is allowed at considerably lower level than the capability at the receiving side, above-mentioned effect can be obtained when the image frame number outputted from the input buffer 601 per unit time is varied.

Also in this embodiment, although the information 707 indicating the time capability of the decoding processing and the image data are multiplied on one transmission line and transmitted, similar effect can be obtained when the information 707 is transmitted through another transmission line.

According to the invention as above described, in the motion compensation circuit, the average value of the input block signals is adopted in matching between blocks, thereby even at large motion amount or at scene change, the frequency error signal is suppressed without increasing the hardware scale or the processing time. As a result, the generated information amount is reduced or the picture quality is improved.

Also according to the invention, since the ON/OFF operation of each coding and decoding device is adaptively selected and changed, the generating amount of the coding information and the reconstructed image quality can be adaptively controlled per frame unit in wide range.

Further according to the invention, since the motion amount of the frame to be encoded hereafter is estimated and the coding control is performed, if the subject is suddenly moved or stands still on the contrary, the interframe coding device without delayed control is obtained.

Further according to the invention, the dimension number of the vectors to be encoded is reduced and the vector quantization is performed in stages. Still further, since the threshold processing is performed at the encoding process of the second stage or later, the block size can be varied without increasing the operation scale of the inner product quantization device, and control of the coded information amount in each stage can be performed at wide range.

Further according to the invention, since the vector quantization device is constituted in multiple stages, vector quantization at the first stage is performed using the average value of blocks being encoding unit at the next stage as constitution element, control range of the information amount is wide, and the picture quality is not extremely deteriorated by the control, and the vector quantization error at the first stage does not adversely affect the coding at the second stage.

Further according to the invention, since the code book of the vector quantization device is composed of a dynamic code book where writing or reading is possible at any time and a fixed code book in the conventional manner, and based on approximation between the input vector and the decoding vector, while content of the dynamic code book is adaptively updated, the vector quantization coding and decoding is executed, thereby deterioration of the approximation of the decoding vector can be suppressed with respect to special input vector being different in property from the output vector group stored in the fixed code book.

Still further according to the invention, since the time capability of the decoding processing at the receiving side is transmitted together with the image data to the remote station, and the time interval of data transmission at the transmitting side is controlled based on the information at the receiving side, normal image communication can be realized even using the device of low cost and small size having low decoding processing capability at the receiving side.

What is claimed is:

1. An average value predicting motion compensation operator, wherein input digital image signals are divided into blocks of prescribed size, and coding operation is performed to differential signals between the block of input signals and interframe predicting signals produced block by block, a circuit for producing a block of predicting signals is constituted by input signal blocks and previous frame blocks disposed on the same position on the previous frame as the input signal blocks, the blocks on the previous frame are given according to L sorts (L: positive integer) of displacement (hereinafter referred to as "motion vector"), and L blocks of the previous frame and average value of the input block is quantized into one of M levels (M: positive integer), further the quantized average value is formed as the value of picture element within the block and total (L+1) blocks are defined as predicting signal blocks (hereinafter referred to as "reference block"), whereby the block pattern matching between the input signal block and the reference blocks is estimated by prescribed measurement method and the block being most matched with the input signal block is picked up from the reference blocks, and the picked up block signal is outputted as the predicting signal block, and if the picked up block is selected from L blocks of the previous frame blocks, the index of the picked up block corresponding to the motion vector is outputted, and if the average value block is selected the index of the picked up block corresponding to the quantized level of the average value is outputted.

2. An average value predicting motion compensation operator as set forth in claim 1, comprising:

a differential absolute value operator which performs pixel by pixel differential absolute value process between a block of input signals and a block of signals disposed on the same position or near the position of the previous frame or a block of samples with the quantized average value as hereinafter described;

an accumulator which performs distortion measure by accumulation of the differential absolute value and average value for each block by summarizing the input signals within the block;

a quantizer which quantizes the average value into one of corresponding levels of the matching distortion;

a comparator which compares the matching distortion calculated with the accumulator between input signals and the signals on the same position or near the position on previous frame or with the quantized average value, and outputs the block of signals on the previous frame to give the minimum distortion or index corresponding to the quantization average value; and a selector which supplies the differential absolute value between the block of input signals and the blocks of signals on the previous frame or the block of input signal to the accumulator.

3. An average value predicting motion compensation operator as set forth in claim 1 or claim 2, wherein in place of the differential absolute value operator, a differential square value operator is used, and difference square value of each picture element is calculated between the input signals and the reference blocks.

4. An average value predicting motion compensation operator as set forth in claim 1 or claim 2, wherein in the accumulator, the matching distortion of each reference block is supplied with different weighting functions thereby the specific reference block as that giving the minimum distortion tends to be selected or not.

5. An image signal progressive build-up encoder/decoder wherein in case of one input image signal system, highly efficient coding and decoding is performed, and obtained reconstructed image signal is delayed by one frame, and the residual signal between the input image signal and the delayed signal is again subjected to highly efficient coding and decoding frame by frame and operation is repeatedly executed, thereby high quality images are achieved by progressive build-up in time progresses, said encoder/decoder comprising:

an average value encoder/decoder which calculates average value with a block of residual signal vectors obtained by forming the block of the residual signal per lattice-shaped m×n (m, n: positive integer) sample, and performs highly efficient coding of the average value;

a normalized vector quantization encoder/decoder which utilizes the residual signal vector as input vector and subtracts the average value from each element of the input vector and obtains the normalized output vector having the maximum inner product value to the input vector among a set of normalized output vectors with average value 0, amplitude 1 generated so that total of distortion is minimized based on the distribution of normalized input vectors of which amplitude becomes 1, and obtains an index to indicate the normalized output vector, and also performs highly efficient coding and decoding of the amplitude gain of the input vector given by the maximum inner product value, and the decoded amplitude gain is multiplied by the detected normalized output vector thereby the amplitude reconstructed output vector can be obtained;

a sample value encoder/decoder which performs highly efficient coding and decoding of m×n block of samples in the residual signal vector sample by sample;

a switch which adaptively controls ON/OFF operation of the average value encoder/decoder, the normalized vector quantization encoder/decoder and the sample value encoder/decoder based on the control signal frame by frame;

a vector reconstructor which selects adaptively the decoded average value, the decoded residual signal vector by adding the decoded average value to the amplitude reconstructed output vector, and the decoded sample value based on the hereinafter described frame by frame control signal, and then outputs them as a decoded vector; and a coding controller which generates a control signal to enable the adaptive control operation of the switch, each encoder/decoder and the vector reconstructor corresponding to the number of coded samples each frame.

6. An image signal progressive build-up encoder/decoder as set forth in claim 5, wherein in the coding controller, at the first coding stage, only the average value encoder/decoder are turned on, and rough image is reconstructed by the decoded vector which all m×n samples are substituted by the decoded average value, and at the second coding stage, the average value encoder/decoder and the normalized vector quantization encoder/decoder are turned on, and the decoded vector substituted by the decoded residual signal vector is obtained, and the image of which quality is better than that of the first stage can be built up, and at the third coding stage or later, only the sample value encoder/decoder is turned on, the decoding vector comprising the decoding value of m×n pixels of sample value is obtained, and the image of which quality is better than that of the second stage can be built up.

7. An image signal progressive build-up encoder/decoder as set forth in any of claim 5 or claim 6 wherein square-root of the mean square error of each sample between the residual signal vector and the decoded vector outputted from the vector reconstructor is calculated as the error amplitude value, and based on the average of the error amplitude value during one frame period and the number of coding stage, the coding and decoding control mode and operation of the switch and the vector reconstructor are adaptively selected and controlled frame by frame at the subsequent coding stage.

8. An image signal progressive build-up encoder/decoder as set forth in claim 5 or claim 6, wherein in the average value encoder/decoder, the normalized vector quantization encoder/decoder and the sample value encoder/decoder, a set of different coding and decoding control modes corresponding to various encoded information generation rate of each coding stage are prepared, and based on the total encoded information generation rate of one frame by frame coding stage and the number of the stage, the coding and decoding control mode, operation of the switch and the vector reconstructor are adaptively selected and controlled frame by frame at the subsequent coding stage.

9. An image signal progressive build-up encoder/decoder as set forth in claim 7, wherein square-root of the mean square error of each sample between the residual signal vector and the decoded vector outputted from the vector reconstructor is calculated as the error amplitude value, and based on the average of the error amplitude value during one frame period and the number of coding stage, the coding and decoding control mode and operation of the switch and the vector reconstructor are adaptively selected and controlled frame by frame at the subsequent coding stage.

10. An interframe motion image encoder wherein a first frame memory which can store motion image signals at least by one frame is provided, interframe predicting signal is obtained utilizing the first frame memory, and interframe prediction error signals are subjected to highly efficient coding and decoding and the encoded data are transmitted, and at the same time decoded image signals are written in the first frame memory and updated for the interframe prediction of the subsequent frame or later, said encoder comprising:
a discriminator which evaluates approximation of the interframe predicting signal to the input motion image signals to be coded, and then compares the approximation with a prescribed threshold value, and in the case of the large approximation, it generates the signal indicating that the interframe predicting signals are treated as the decoded signal;
an encoder and decoder which performs coding and decoding operation in the case of a small approximation;
a second frame memory which can store the input motion image signals at least by one frame, and memorises the input image signals before coding operation;
an estimator which performs substraction of the image signals of the previous frame read from the second frame memory and the input image signal, and then performs integration frame by frame and obtains the estimation value of the information generation amount of the current frame; and
a coding controller which judges the threshold value of the current coding frame corresponding to the corrected motion amount in order to smooth the information generation rate based on the method: the motion amount is estimated from the threshold value and the information generation amount of the previous coding frame, and then the motion amount is corrected by the estimated information generation amount of the current coding frame outputted from the estimator according to estimate the motion amount of the current coding frame, and the corrected motion amount is determined.

11. An image signal progressive build-up encoder wherein to one input image frame, input signals are subjected to highly efficient coding and decoding and reconstructed image signals are delayed by one frame period, and the residual signals between the input image signals and the delayed signals are subjected to highly efficient coding and decoding frame by frame respectively and operation is repeatedly performed, thereby a high quality and resolution image is built up progressively as time progresses, said encoder comprising:
a vector/subvector transformer which forms lattice-shaped am sample $\times$ bn line (a, b, m, n: natural number and am=a$\times$m, and bn=b$\times$n) residual signals into an L-dimensional (L=am$\times$bn)vector, and forms lattice-shaped m$\times$n average values calculated within the blocks of a sample$\times$b line residual signals respectively into a K-dimensional (K=m$\times$n) subvector;
an average value encoder and decoder which performs highly efficient coding and decoding of the arithmetic mean of the sample within the residual signal subvector;
K-dimension normalized vector quantization encoder and decoder which treats the residual signal subvector as K-dimension input vector, and performs vector quantization of the input vector through the inner product operation of K dimensions into K-dimension normalized output vector of average value 0 and amplitude 1, and performs highly efficient coding and decoding of the amplitude gain of the residual signal subvector given by the inner product value between normalized output vector and the input vector;
a subvector/vector de-transformer which arranges samples within the decoded K-dimension residual signal subvector obtained by multiplying the normalized output vector and the decoded amplitude gain, and each element of the K-dimension amplitude reconstructed output vector corresponding to lattice-shaped m sample$\times$n line subvector is added to the decoded average value, thereby performs interpolation of the decoded residual signal vector having the L dimensions; and decreases the size of the lattice-shaped block of the residual signals step by step and to execute the coding and decoding operation repeatedly.

12. An image signal progressive build-up encoder as set forth in claim 11, wherein at the first coding stage, the input image signals are combined by lattice-shaped m sample$\times$n line and average value within the block is treated as one sample, and the samples are further combined in lattice-shaped m$\times$n samples into K-dimension input vector and the K-dimension mean separated and normalized vector quantization is performed for the K-dimension input vector, and at the subsequent coding stage, the K-dimension mean separated and normalized vector quantization is performed again respectively by combination of the lattice-shaped m sample$\times$n line the residual signals thereby hierarchical coding and decoding for each block can be performed.

13. An image signal progressive build-up encoder as set forth in claim 11 or claim 12, wherein at the subsequent coding stage, the square mean of the sample value within the block by combination of the lattice-shaped m sample$\times$n line residual signals is compared with the threshold value, and block by block conditional replenishment is executed for coding and decoding of only the block having the square mean value larger than the threshold value, and binary information indicating the result of the threshold comparison is subjected to highly efficient coding and decoding.

14. An interframe vector quantizer in hierarchical multi-stage structure, comprising:
a frame memory which can store image signals of at least one frame;
a subtractor which subtracts interframe predictive signals from input motion image signals to form interframe differential signals;
average value and amplitude operation circuit which forms the interframe differential signals obtained by the subtractor into the blocks with horizontal m picture elements by vertical n lines (m, n being positive integers) and calculates the first average value and amplitude;

a block discrimination circuit of the first stage which compares the first average value and amplitude with the threshold value of the first stage;

an average value separation and normalization circuit of the first stage which forms the first average values into blocks of horizontal m by vertical n corresponding spatially to m x n blocks of the interframe differential signals and calculates second average value and amplitude and subtracts the second average value from the block of the first average values;

a code table of the first stage which stores a set of output vectors suited for the distribution of the input vector assuming that the block of the first average values is the input vector of the first stage;

a distortion operation circuit of the first stage which calculates distortion between the input vector of the first stage and the output vector;

a minimum distortion detecting circuit which detects the optimum output vector of the first stage which gives the minimum distortion and determines the index of the optimum output vector of the first stage;

a decoding circuit of the first stage which multiplies the optimum output vector of the first stage by the second amplitude and adds the second average value thereby obtains the decoded vector of the first stage;

a subtractor which subtracts the decoded vector of the first stage from the interframe differential signal and obtains the error signal;

an average value separation and normalization circuit of the next stage which forms the error signals into the blocks with horizontal m elements by vertical n lines so that the blocks of the error signals corresponding spatially to the blocks of the interframe differential signals formed by the average value and amplitude operation circuit of the first-stage, and calculates the third average values and amplitude regarding blocks except for the block where the first average value and the amplitude are less than the threshold value of the first stage, and subtracts the third average value from the block of error signals and normalizes at the third amplitude;

a block discrimination circuit of the next stage which compares the third average value and amplitude with the threshold value of the next stage;

a code table of the next stage which stores a set of output vectors suited for the distribution of the input vectors of the next stage assuming that the blocks of the error signals except for ones where the third average value and amplitude are less than the threshold value of the next stage in the block discrimination circuit of the second stage;

a distortion operation circuit of the next stage which calculates distortion distance between the input vector of the next stage and the output vector;

a minimum distortion detecting circuit of the next stage which detects the optimum output vector of the next stage which gives the minimum distortion among the distortion calculated by the distortion operation circuit of the next stage and determines the index of the optimum output vector;

a decoding circuit of the next stage which multiplies the optimum output vector of the next stage by the third amplitude and adds the third average value thereby obtains the decoded vector of the next stage;

an adder which adds the decoded vector of the first stage and the decoded vector of the next stage and forms the decoded interframe differential signals;

an adder which adds the decoded interframe differential signals to the interframe predictive signals and obtains the decoded image signal;

a variable length coding section which operates variable length coding of the second and third average value and amplitude and the index of the optimum output vector of the first stage and the next stage and the result of the block discrimination circuit of the first stage and the next stage; and a buffer which temporarily stores data subjected to variable length coding and performs smoothing of the amount of information to be transmitted, wherein when the first average value and amplitude are detected to be less than the threshold value of the first stage by the block discrimination circuit of the first stage, the decoded vector at the first stage and the corresponding blocks of the next stage are assumed as zero vectors, when the third average value and amplitude are less than the threshold value of the next stage the decoded vector of the next is assumed as zero vector, and threshold value at the first stage and the next stage is hierarchically controlled when the storage amount in the buffer is supposed as at least one of the control condition.

15. An interframe vector quantizer as set forth in claim 14, wherein when distortion distance between input vector of the first stage and output vector read from the code book of the first stage is determined in the distortion operation circuit of the first stage, element of the input vector of the first stage corresponding to the block having the first average value and amplitude less than the threshold value in comparison in the block discrimination circuit of the first stage is ignored in process of the distortion calculation.

16. An interframe vector quantizer as set forth in claim 14, wherein before the third average value and amplitude are subjected to variable length coding in the variable length coding section, a quantizer of average value and amplitude of subsequent stage having a plurality of quantization characteristics is previously provided, and the plurality of quantization characteristics are adaptively changed by the second amplitude obtained in the average value separation and normalization circuit of the first stage.

17. An interframe vector quantizer as set forth in claim 14, wherein plural sets of output vectors having different characteristics are stored in the code table of the next stage, and the plurality of quantizing characteristics are adaptively changed by the second amplitude obtained in the average value separation and normalization circuit of the first stage.

18. A dynamic vector quantizer provided with a coding section comprising:

an average value separation circuit which separates the average value within a block from input vectors formed with every k samples (k being integer of two or more) of input signal;

an average value coding circuit which encodes the average value;

a normalization circuit which normalizes the average value separated input vector obtained through average value separation by the average value separation circuit according to the amplitude of the input vector;

a fixed code book which stores a plurality of normalized output vectors suited for the distribution of the normalized input vectors;

a dynamic code book which stores the plurality of normalized input vectors supposing them as normalized output vectors, the stored content being updated;

an inner product operation section which calculates inner product value between the average value separated input vector and a plurality of normalized output vectors stored in the fixed code book and the dynamic code book;

a maximum inner product detecting section for finding maximum inner product value among a plurality of inner product values calculated by the inner product operation section;

an amplitude coding circuit which encodes either the maximum inner product value or the normalization coefficient;

a dynamic code book control section which calculates a degree of approximation between the input vector and the decoded vector after vector quantization of the input vector using the maximum inner product value and the normalization coefficient, and controls the updating operation of the dynamic code book based on comparison result of the degree of approximation and threshold value previously set;

a coded data multiplexing section which multiplexes either discrimination code relating to the update procedure, the output data of the average value coding circuit, the output data of the amplitude coding circuit and the maximum inner product value or normalized output vector and the discrimination code is attached according to the prescribed format, and then transmits it;

means which calculates the degree of approximation with the normalization coefficient and the maximum inner product value and selects the maximum inner product value as input signal to the amplitude coding circuit when the degree of approximation is larger than the threshold value, and defines the input signal to the coding data multiplexing section with the discrimination code, of the output data of the average value coding circuit, the output data of the amplitude coding circuit and the normalized output vector; and means which replaces the oldest normalized input vector stored in the dynamic code book corresponding to the input vector with the normalized input vector thereby executes the update operation when the degree of approximation is less than the threshold value, and selects the normalization coefficient as input signal to the amplitude coding circuit, and further defines the input signal to the coding data multiplexing section with the normalized input vector and the output data of the average value coding circuit, the output data of the amplitude coding circuit and the discrimination symbol indicating that the updating operation has been done thereto, decoding section comprising:

a coded data demultiplexing section which separates the coded data transmitted from the coding section into the average value coded data, the amplitude coded data and the discrimination symbol according to the prescribed format;

an average value decoding circuit which decodes the average value coded data;

an amplitude decoding circuit which decodes the amplitude coded data;

a fixed code book and a dynamic code book corresponding to the fixed code book and the dynamic code book at the side of the coding section respectively;

means which reads the normalized output vector on the address indicated by the discrimination symbol from the fixed code book or the dynamic code book when the discrimination symbol indicates the normalized output vector, and performs prescribed operation based on the normalized output vector, the decoded amplitude value outputted from the amplitude decoding circuit, and the decoded average value outputted from the average value decoding circuit thereby obtains the decoded vector to the input vector; and means which replaces the oldest vector stored in the dynamic code book with the normalized input vector received following the discrimination symbol in the case that the discrimination symbol indicates the update operation thereby executes similar to the update in the coding section, and performs prescribed operation of the normalized input vector based on the decoded amplitude value and decoded average value thereby obtains the decoded vector to the input vector.

19. A dynamic vector quantizer as set forth in claim 18, wherein in the coding section, a plurality of normalized output vectors within the fixed code book are arranged in tree structure in step per $2^n$ (n: natural number), and a normalized output vector giving the maximum inner product value to the input vector is selected among $2^n$ pieces of the normalized output vectors in sequence from upper step of the tree structure towards lower step and tree searching method is used.

20. A dynamic vector quantizer as set forth in claim 18, wherein the normalization circuit performs normalization using the root of the sum of the squared average value-separated-input vector as the normalization coefficient.

21. A dynamic vector quantizer as set forth in claim 18, wherein the fixed code book stores a plurality of normalized output vectors with average value zero and magnitude 1 determined depending on the statistical characteristics of plural normalized input vectors.

22. A dynamic vector quantizer as set forth in claim 18, wherein the degree of approximation between the input vector and the decoded vector after vector quantization is estimated using the squared normalization coefficient and the squared maximum inner product value.

23. A dynamic vector quantizer as set forth in claim 18, wherein the discrimination symbol indicates the existence of the index corresponding to the output vector, the normalized output vector is multiplied by the decoded amplitude value and the product is added to the decoded average value.

24. A dynamic vector quantizer as set forth in claim 18, wherein the discrimination symbol indicates that the update operation has been done, the normalized input vector is multiplied by the decoded amplitude value and the product is added to the decoded average value.

25. An image coding and decoding transmission system including at least two image transmitting/receiving stations, each station comprising:
 a transmitter including
  means for inputting a digitized image signal,
  means for encoding said digitized image signal,
  means for generating information data representing the amount of time required for a decoding process of the station, and
  means for multiplying and transmitting said encoded digitized image signal and said information data; and
 a receiver including
  means for receiving multiplexed signals from a remote station,
  means for separating, from said multiplexed signals, information data representing the amount of time required for a decoding process of said remote station from coded image signal data,
  means for decoding said coded image signal data, and
  means for outputting said separated information data to said transmitter to control the coding processing speed to match the decoding processing time of said remote station.

26. An image coding and decoding transmission system as set forth in claim 25, wherein based on the information indicating time requirement of the decoding process of the remote station, the number of image frames to be coded per unit time in the transmitter may be controlled.

27. An image coding and decoding transmission system as set forth in claim 25, wherein based on the information indicating time requirement of the decoding process of the remote station, the number of image frames to be transmitted per unit time in the transmitter may be controlled.

28. An image coding and decoding transmission system as set forth in claim 25, wherein based on information indicating time requirement of the decoding process of the remote station, the minimum value of a time interval between the transmitting of the code corresponding to the lead of each image frame at the transmitter may be controlled.

* * * * *

UNITED STATES PATENT AND TRADEMARK OFFICE
CERTIFICATE OF CORRECTION

PATENT NO. : 4,933,761

DATED : June 12, 1990            Page 1 of 16

INVENTOR(S) : TOKUMICHI MURAKAMI ET AL.

It is certified that error appears in the above-identified patent and that said Letters Patent is hereby corrected as shown below:

Title page, col. 2, [57], line 5, "forcasting" should be --forecasting--.

In the Drawings, "Sheet 1 of 19" should be --Sheet 1 of 29--;
"Sheet 2 of 19" should be --Sheet 2 of 29--;
"Sheet 3 of 19" should be --Sheet 3 of 29--;
"Sheet 4 of 19" should be --Sheet 4 of 29--;
"Sheet 5 of 19" should be --Sheet 5 of 29--;
"Sheet 6 of 19" should be --Sheet 6 of 29--;
"Sheet 7 of 19" should be --Sheet 7 of 29--;
"Sheet 8 of 19" should be --Sheet 8 of 29--;
"Sheet 9 of 19" should be --Sheet 9 of 29--;
"Sheet 10 of 19" should be --Sheet 10 of 29--;
"Sheet 11 of 19" should be --Sheet 11 of 29--;
"Sheet 12 of 19" should be --Sheet 12 of 29--;
"Sheet 13 of 19" should be --Sheet 13 of 29--;
"Sheet 14 of 19" should be --Sheet 14 of 29--;
"Sheet 15 of 19" should be --Sheet 15 of 29--;
"Sheet 16 of 19" should be --Sheet 16 of 29--;
"Sheet 17 of 19" should be --Sheet 17 of 29--;
"Sheet 18 of 19" should be --Sheet 18 of 29--;
"Sheet 19 of 19" should be --Sheet 19 of 29--;

UNITED STATES PATENT AND TRADEMARK OFFICE
CERTIFICATE OF CORRECTION

PATENT NO. : 4,933,761
DATED : June 12, 1990                    Page 2 of 16
INVENTOR(S) : TOKUMICHI MURAKAMI ET AL.

It is certified that error appears in the above-identified patent and that said Letters Patent is hereby corrected as shown below:

In the Drawings, please insert "Sheet 20 of 29"

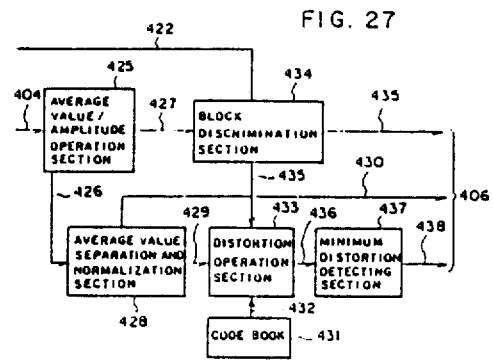

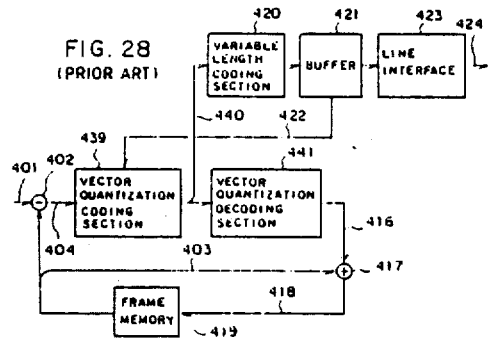

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

In the Drawings, please insert "Sheet 21 of 29"

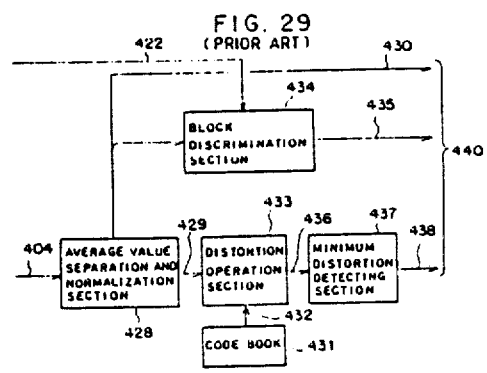

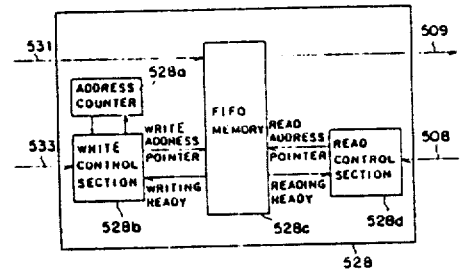

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

Page 4 of 16

It is certified that error appears in the above-identified patent and that said Letters Patent is hereby corrected as shown below:

In the Drawings, please insert "Sheet 22 of 29"

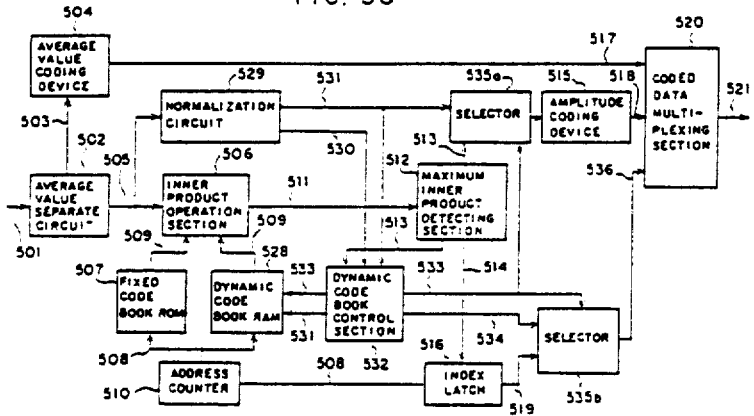

FIG. 30

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

Page 5 of 16

It is certified that error appears in the above-identified patent and that said Letters Patent is hereby corrected as shown below:

In the Drawings, please insert "Sheet 23 of 29"

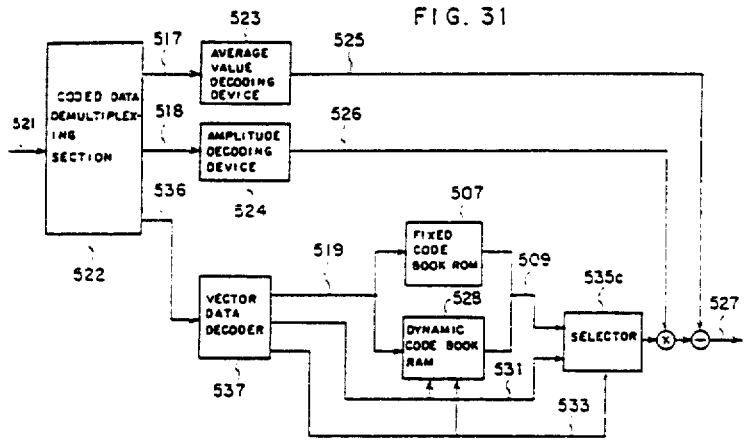

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

In the Drawings, please insert "Sheet 24 of 29"

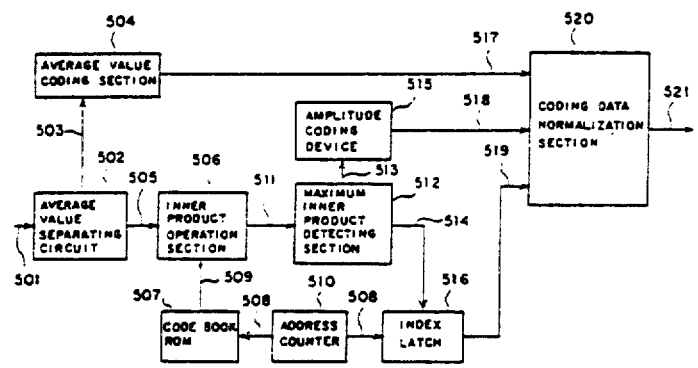

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

In the Drawings, please insert "Sheet 25 of 29"

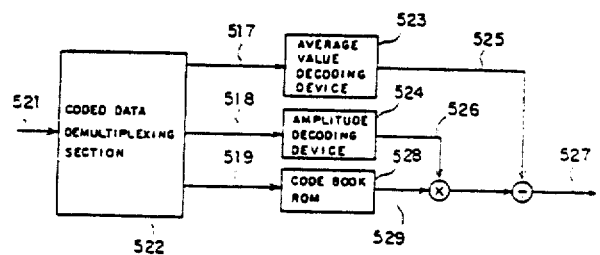

FIG. 34 (PRIOR ART)

UNITED STATES PATENT AND TRADEMARK OFFICE
CERTIFICATE OF CORRECTION

PATENT NO. : 4,933,761

DATED : June 12, 1990

INVENTOR(S) : TOKUMICHI MURAKAMI ET AL.

Page 8 of 16

It is certified that error appears in the above-identified patent and that said Letters Patent is hereby corrected as shown below:

In the Drawings, please insert "Sheet 26 of 29"

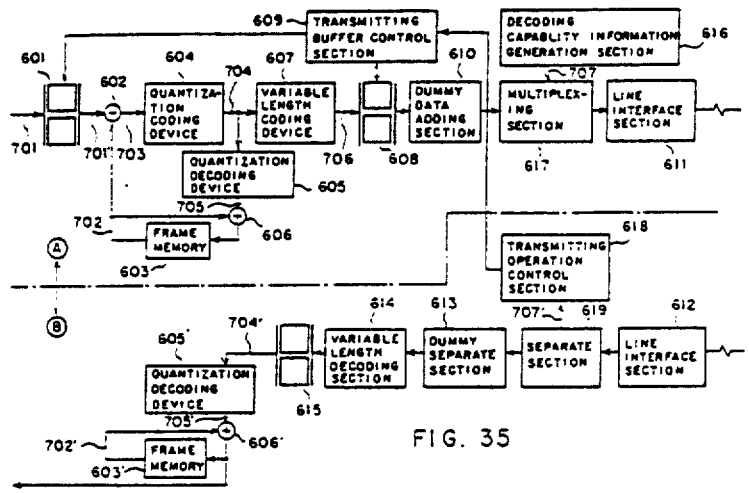

FIG. 35

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

Page 9 of 16

It is certified that error appears in the above-identified patent and that said Letters Patent is hereby corrected as shown below:

In the Drawings, please insert "Sheet 27 of 29"

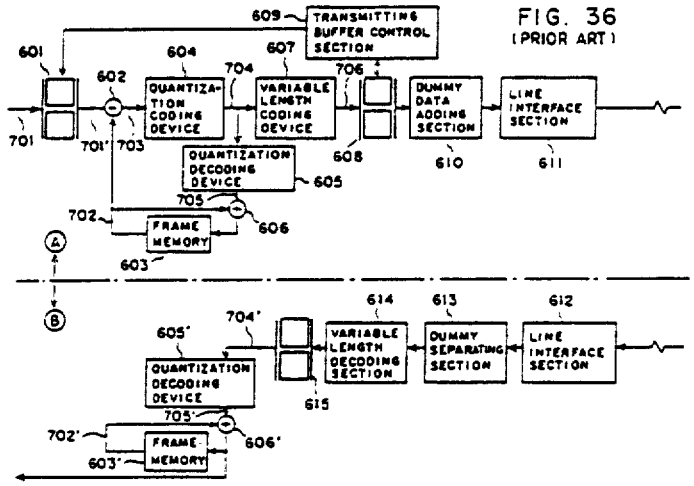

FIG. 36 (PRIOR ART)

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

In the Drawings, please insert "Sheet 28 of 29"

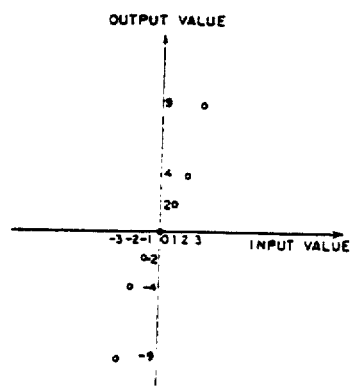

FIG. 38

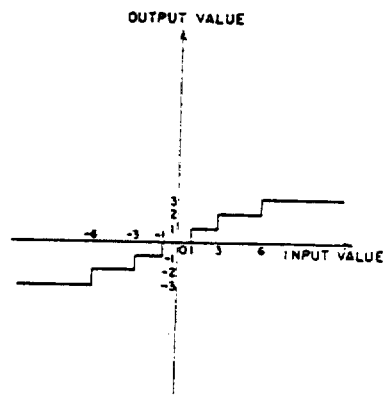

FIG. 37

UNITED STATES PATENT AND TRADEMARK OFFICE
CERTIFICATE OF CORRECTION

PATENT NO. : 4,933,761

DATED : June 12, 1990

INVENTOR(S) : TOKUMICHI MURAKAMI ET AL.

It is certified that error appears in the above-identified patent and that said Letters Patent is hereby corrected as shown below:

In the Drawings, please insert "Sheet 29 of 29"

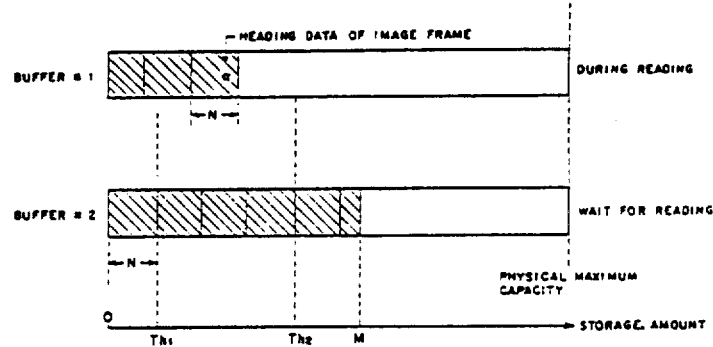

FIG. 39

UNITED STATES PATENT AND TRADEMARK OFFICE
CERTIFICATE OF CORRECTION

PATENT NO. : 4,933,761

DATED : June 12, 1990

INVENTOR(S) : TOKUMICHI MURAKAMI ET AL.

It is certified that error appears in the above-identified patent and that said Letters Patent is hereby corrected as shown below:

Col. 1, line 34, "shift" should be --shifted--;
       line 42, "be" should be --is--;
       line 43, after "$N_2$" insert a period.

Col. 2, line 58, "code" should be --coding--;
       same line, "coding" should be --code--;
       line 68, "$Y_{ik}$" should be --$y_{ik}$--.

Col. 3, line 1, "(x" should be --($\underline{x}$--.

Col. 4, line 51, after "stage" insert --is--.

Col. 5, line 35, after "blocks" insert --,--.

Col. 6, line 22, after "curve" insert --,--.

Col. 7, line 4, "value" should be --data--.

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

Col. 8, lines 1-5, the formula $$" \quad |y_i| = \left\{ \sum_{j=1}^{K} y^2_{ij} \right\}^{1/2} = 1, \sum_{j=1}^{K} y_{ij} = 0 \quad "$$

should be

-- if $I(\underline{x}, \underline{y_i}) > I(\underline{x}, \underline{y_\ell})$ for all $\ell$ $$[I(\underline{x}, \underline{y_i}) = \sum_{j=1}^{K} (x_j y_{ij})]$$

$$\underline{x} \rightarrow \underline{y_i}$$

$$g = I(\underline{x}, \underline{y_i}) = |\underline{x}||\underline{y_i}|\cos\theta_i = |\underline{x}|\cos\theta_i \quad --.$$

Col. 8, line 17, "data" should be --value--;
same line, "value" should be --data--.

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

Col. 9, line 2, after "a" insert --threshold--;
      line 44, after "adder" insert --417;--;
      line 46, "," should be --;--.

Col. 10, line 12, "]obtained" should be --] obtained--;
      line 55, "coded" should be --coding--;
      same line, "coding" should be --coded--;
      line 67, "coded" should be --decoded--.

Col. 12, line 11, after "device" insert --,--;
      line 60, "X*" should be --$\underline{X}$*--;
      same line, "writtin" should be --written--.

Col. 16,
      line 38, ">" should be --<--;

Col. 19, line 23, "m" should be --$\underline{m}$--.

UNITED STATES PATENT AND TRADEMARK OFFICE
CERTIFICATE OF CORRECTION

PATENT NO. : 4,933,761

DATED : June 12, 1990

INVENTOR(S) : TOKUMICHI MURAKAMI ET AL.

It is certified that error appears in the above-identified patent and that said Letters Patent is hereby corrected as shown below:

Col. 27, line 11, "input vector; s" should be --input vector; $\underline{s}$--;
line 12, "subvector; u" should be --subvector; $\underline{u}$--;
line 68, "decoding" should be --decoded--.

Col. 28, line 57, "28" should be --27--;
line 65, "coded" should be --coding--;
line 66, "coding" should be --coded--.

Col. 29, line 17, "18" should be --418--.

Col. 30, line 38, "455" should be --405--.

Col. 31, line 5, "u" should be --$\underline{u}$--;
line 29, after "pieces" insert --is--.

UNITED STATES PATENT AND TRADEMARK OFFICE
CERTIFICATE OF CORRECTION

PATENT NO. : 4,933,761
DATED : June 12, 1990
INVENTOR(S) : TOKUMICHI MURAKAMI ET AL.

It is certified that error appears in the above-identified patent and that said Letters Patent is hereby corrected as shown below:

Col. 33, line 17, after "535a" delete "tl";
        line 36, after "art," delete " ' ".

Col. 34, line 8, "x* =" should be --$\underline{x}$* = --.

Col. 38, line 68, after "only" insert --if--.

Col. 39, line 14, "outs" should be --out,--;
        line 60, "coding" should be --coded--.

Col. 41, line 54, delete "with", should be --within--.

Col. 42, line 48, delete "any of";
        same line, after "6" insert --,--.

Col. 43, line 37, "memorises" should be --memorizes--.

Signed and Sealed this

Seventh Day of April, 1992

*Attest:*

HARRY F. MANBECK, JR.

*Attesting Officer*      *Commissioner of Patents and Trademarks*